(12) United States Patent
Jang et al.

(10) Patent No.: US 12,237,290 B2
(45) Date of Patent: Feb. 25, 2025

(54) SEMICONDUCTOR PACKAGES AND METHODS OF MANUFACTURING THE SEMICONDUCTOR PACKAGES

(71) Applicant: Samsung Electronics Co., Ltd., Suwon-si (KR)

(72) Inventors: Aenee Jang, Seoul (KR); Younglyong Kim, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 112 days.

(21) Appl. No.: 16/912,819

(22) Filed: Jun. 26, 2020

(65) Prior Publication Data

US 2021/0111140 A1   Apr. 15, 2021

(30) Foreign Application Priority Data

Oct. 11, 2019   (KR) .................. 10-2019-0126109

(51) Int. Cl.
*H01L 23/00*   (2006.01)
*H01L 23/31*   (2006.01)
*H01L 25/065*   (2023.01)

(52) U.S. Cl.
CPC .......... *H01L 24/20* (2013.01); *H01L 23/3121* (2013.01); *H01L 24/13* (2013.01);
(Continued)

(58) Field of Classification Search
CPC ..... H01L 25/0657; H01L 24/97; H01L 24/83; H01L 23/481; H01L 2224/02379;
(Continued)

(56) References Cited

U.S. PATENT DOCUMENTS 8,247,895 B2   8/2012   Haensch et al.
8,653,676 B2   2/2014   Kim et al.
(Continued)

FOREIGN PATENT DOCUMENTS

CN   201710954765   10/2017
KR   101519307 B1   5/2015
(Continued)

OTHER PUBLICATIONS

Website: Law Insider definition of "Integrally formed" (https://www.lawinsider.com/dictionary/integrally-formed).*
(Continued)

*Primary Examiner* — Younes Boulghassoul
*Assistant Examiner* — Quinton A Brasfield
(74) *Attorney, Agent, or Firm* — Myers Bigel, P.A.

(57) ABSTRACT

A semiconductor package includes a first semiconductor chip including a first substrate having first and second surfaces opposite to each other, a through electrode in the first substrate, a first chip pad on the first surface and electrically connected to the through electrode, and a second chip pad on the first surface and electrically connected to a circuit element in the first substrate; a redistribution wiring layer on the first surface of the first semiconductor chip, and including a first redistribution wiring line electrically connected to the first chip pad and a second redistribution wiring line electrically connected to the second chip pad; a second semiconductor chip stacked on the second surface of the first semiconductor chip and electrically connected to the through electrode; and a molding member on side surfaces of the first and second semiconductor chips.

20 Claims, 28 Drawing Sheets

(52) U.S. Cl.
CPC .............. *H01L 24/29* (2013.01); *H01L 24/73* (2013.01); *H01L 25/0657* (2013.01); *H01L 2224/73103* (2013.01)

(58) Field of Classification Search
CPC ......... H01L 2224/023–024; H01L 2224/0235; H01L 2224/02372; H01L 2224/02373; H01L 23/49822; H01L 23/5383; H01L 25/043; H01L 25/074; H01L 25/0756; H01L 25/117; H01L 2224/08145; H01L 23/49827; H01L 23/5384; H01L 29/4175; H01L 2225/06541–06544; H01L 2225/06548; H01L 21/76898; H01L 23/3185; H01L 23/3157; H01L 25/0652; H01L 25/071; H01L 25/112; H01L 27/0688

See application file for complete search history.

(56) References Cited

U.S. PATENT DOCUMENTS

| | | | |
|---|---|---|---|
| 8,736,076 B2 | 5/2014 | Hawk | |
| 8,803,332 B2 | 8/2014 | Lee et al. | |
| 8,872,335 B2 * | 10/2014 | Huebner | H05K 3/305 |
| | | | 257/737 |
| 8,883,561 B2 | 11/2014 | Park et al. | |
| 8,945,985 B2 | 2/2015 | Kim et al. | |
| 9,209,156 B2 | 12/2015 | Len et al. | |
| 9,259,902 B2 | 2/2016 | Yu et al. | |
| 9,269,693 B2 | 2/2016 | Chan et al. | |
| 9,496,196 B2 | 11/2016 | Yu et al. | |
| 9,754,892 B2 | 9/2017 | Kwon et al. | |
| 9,793,217 B2 | 10/2017 | Lee et al. | |
| 9,899,443 B2 | 2/2018 | Lee et al. | |
| 9,941,252 B2 * | 4/2018 | Lee | H01L 23/481 |
| 10,011,098 B2 | 7/2018 | Yu et al. | |
| 10,037,974 B2 * | 7/2018 | Chang Chien | H01L 23/3672 |
| 10,262,967 B2 | 4/2019 | Hwang et al. | |
| 10,381,326 B2 | 8/2019 | Woychik et al. | |
| 2011/0133333 A1 * | 6/2011 | Kwon | H01L 23/481 |
| | | | 257/E21.585 |
| 2012/0077314 A1 | 3/2012 | Park et al. | |
| 2012/0088332 A1 * | 4/2012 | Lee | H01L 21/561 |
| | | | 257/E21.499 |
| 2012/0273959 A1 * | 11/2012 | Park | H01L 23/481 |
| | | | 257/774 |
| 2012/0273960 A1 * | 11/2012 | Park | H01L 23/49827 |
| | | | 257/774 |
| 2013/0056866 A1 * | 3/2013 | Samoilov | H01L 21/565 |
| | | | 257/737 |
| 2014/0291854 A1 | 10/2014 | Lee et al. | |
| 2015/0041980 A1 * | 2/2015 | Ahn | H01L 21/6835 |
| | | | 257/738 |
| 2015/0162301 A1 | 6/2015 | Huang et al. | |
| 2015/0348940 A1 | 12/2015 | Woychik et al. | |
| 2016/0190098 A1 * | 6/2016 | Chen | H01L 21/78 |
| | | | 257/777 |
| 2016/0351499 A1 | 12/2016 | Kitada | |
| 2017/0358558 A1 | 12/2017 | Lee | |
| 2019/0057949 A1 | 2/2019 | Hwang et al. | |
| 2020/0006242 A1 * | 1/2020 | Jee | H01L 21/4857 |

FOREIGN PATENT DOCUMENTS

| | | |
|---|---|---|
| KR | 101540927 | 7/2015 |
| WO | 2013100710 A1 | 7/2013 |

OTHER PUBLICATIONS

European Search Report Corresponding to European Application No. 20198241.0 (15 pages) (Feb. 11, 2021).

* cited by examiner

SEMICONDUCTOR PACKAGES AND METHODS OF MANUFACTURING THE SEMICONDUCTOR PACKAGES

CROSS-REFERENCE TO RELATED APPLICATION

This application claims priority under 35 U.S.C. § 119 to Korean Patent Application No. 10-2019-0126109, filed on Oct. 11, 2019 in the Korean Intellectual Property Office (KIPO), the contents of which are herein incorporated by reference in their entirety.

BACKGROUND

1. Field

Example embodiments relate to semiconductor packages and methods of manufacturing the semiconductor packages.

2. Description of the Related Art

A Fan-In wafer level package having relatively short signal transmission lengths may have excellent signal integrity (SI) characteristics. However, for the Fan-In wafer level package, a redistribution wiring layer is formed directly on a Fab-Out wafer, and it thus may not be easy to apply to a stack package. Further, during manufacture of the Fan-In wafer level package, cracks may occur during a test process using a solder balls as outer connection terminals.

SUMMARY

Example embodiments provide a semiconductor package capable of realizing high bandwidth and high density and having excellent signal integrity characteristics.

Example embodiments provide a method of manufacturing the semiconductor package.

According to example embodiments, a semiconductor package includes a first semiconductor chip including a first substrate having a first surface and a second surface opposite to the first surface, a through electrode in the first substrate, a first chip pad on the first surface and electrically connected to the through electrode, and a second chip pad on the first surface and electrically connected to a circuit element in the first substrate; a redistribution wiring layer on the first surface of the first semiconductor chip, and including a first redistribution wiring line electrically connected to the first chip pad and a second redistribution wiring line electrically connected to the second chip pad; a second semiconductor chip stacked on the second surface of the first semiconductor chip and electrically connected to the through electrode; and a molding member on a side surface of the first semiconductor chip and a side surface of the second semiconductor chip.

According to example embodiments, a semiconductor package includes a first semiconductor chip having a first surface and a second surface opposite to the first surface, and including a first chip pad in the first surface to be electrically connected to a through electrode that is in the first semiconductor chip and a second chip pad in the first surface to be electrically connected to a circuit element that is in the first semiconductor chip; a second semiconductor chip stacked on the second surface of the first semiconductor chip and electrically connected to the through electrode of the first semiconductor chip by a conductive bump; a redistribution wiring layer on the first surface of the first semiconductor chip, and including a first redistribution wiring line electrically connected to the first chip pad and a second redistribution wiring line electrically connected to the second chip pad; and outer connection members on an outer surface of the redistribution wiring layer and electrically connected to the first and second redistribution wiring lines, respectively.

According to example embodiments, a semiconductor package includes a redistribution wiring layer including a first redistribution wiring line and a second redistribution wiring line; a first semiconductor chip on the redistribution wiring layer, and including a first chip pad electrically connected to the first redistribution wiring line, a second chip pad electrically connected to the second redistribution wiring line and a through electrode electrically connected to the first chip pad; a second semiconductor chip stacked on the first semiconductor chip and electrically connected to the through electrode; a molding member on a side surface of the first semiconductor chip and a side surface of the second semiconductor chip; and outer connection members on an outer surface of the redistribution wiring layer.

According to example embodiments, in a method of manufacturing a semiconductor package, a first semiconductor chip is formed, the first semiconductor chip including a first substrate having a first surface and a second surface opposite to the first surface, a through electrode in the first substrate, a first chip pad on the first surface and electrically connected to the through electrode, and a second chip pad on the first surface and electrically connected to a circuit element in the first substrate. A redistribution wiring layer is formed, the redistribution wiring layer on the first surface of the first semiconductor chip, and including a first redistribution wiring line electrically connected to the first chip pad and a second redistribution wiring line electrically connected to the second chip pad. A second semiconductor chip is stacked on the first semiconductor chip such that the second surface of the first semiconductor chip faces the second semiconductor chip and the second semiconductor chip is electrically connected to the through electrode. A molding member is formed to on a side surface of the first semiconductor chip and a side surface of the second semiconductor chip.

According to example embodiments, a semiconductor package as a fan-in wafer level package and a stack package may include a redistribution wiring layer on a first surface of a first semiconductor chip and a second semiconductor chip stacked on a second surface of the first semiconductor chip. First and second outer connection members may be on package pads of the redistribution wiring layer.

The first outer connection member may be electrically connected to the second semiconductor chip through a first redistribution wiring line of the redistribution wiring layer and a through electrode of the first semiconductor chip as a first input/output signal line. The second outer connection member may be electrically connected to the first semiconductor chip through a second redistribution wiring line of the redistribution wiring layer as a second input/output signal line.

Thus, the semiconductor package may provide the stack package of the first and second semiconductor chips stacked via conductive bumps to thereby realize high bandwidth and high density. Because input/output signals are input/output to/from the first and second semiconductor chips through the first and second input/output signal lines separated (e.g., electrically isolated) from each other, signal transmission lengths may be shortened to thereby increase/optimize signal integrity (SI).

Further, a molding member may be on side surfaces of the first semiconductor chip and the second semiconductor chips 300, to thereby inhibit/prevent a crack from occurring during a package test process using the outer connection members on an outer surface of the redistribution wiring layer.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments.

FIG. 2 is an enlarged cross-sectional view illustrating portion 'A' in FIG. 1.

FIGS. 3 to 20 are cross-sectional views illustrating a method of manufacturing a semiconductor package in accordance with example embodiments.

FIG. 21 is a cross-sectional view illustrating a semiconductor package in accordance with example embodiments.

FIG. 22 is a cross-sectional view illustrating a method of manufacturing a semiconductor package in accordance with example embodiments.

FIG. 23 is a cross-sectional view illustrating a semiconductor package in accordance with example embodiments.

FIG. 24 is a cross-sectional view illustrating a method of manufacturing a semiconductor package in accordance with example embodiments.

FIG. 25 is a cross-sectional view illustrating a semiconductor package in accordance with example embodiments.

FIG. 26 is a cross-sectional view illustrating a method of manufacturing a semiconductor package in accordance with example embodiments.

FIG. 27 is a cross-sectional view illustrating a semiconductor package in accordance with example embodiments.

FIG. 28 is an enlarged cross-sectional view illustrating portion 'E' in FIG. 27.

FIGS. 29 to 34 are cross-sectional views illustrating a method of manufacturing a semiconductor package in accordance with example embodiments.

FIG. 35 is a cross-sectional view illustrating a semiconductor package in accordance with example embodiments.

FIG. 36 is an enlarged cross-sectional view illustrating portion 'F' in FIG. 35.

FIG. 37 is an enlarged cross-sectional view illustrating portion 'G' in FIG. 35.

FIGS. 38 to 46 are cross-sectional views illustrating a method of manufacturing a semiconductor package in accordance with example embodiments.

DETAILED DESCRIPTION

Hereinafter, example embodiments will be explained in detail with reference to the accompanying drawings.

Figure 1:
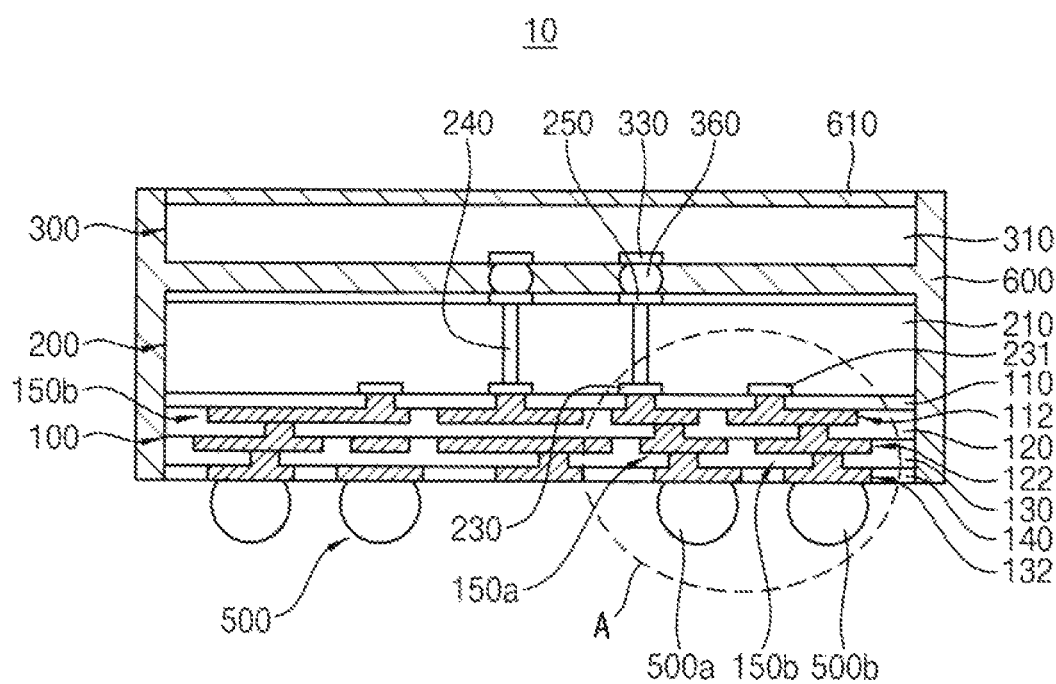
FIGS. 1 to 46 represent non-limiting, example embodiments as described herein.
Figure 2:
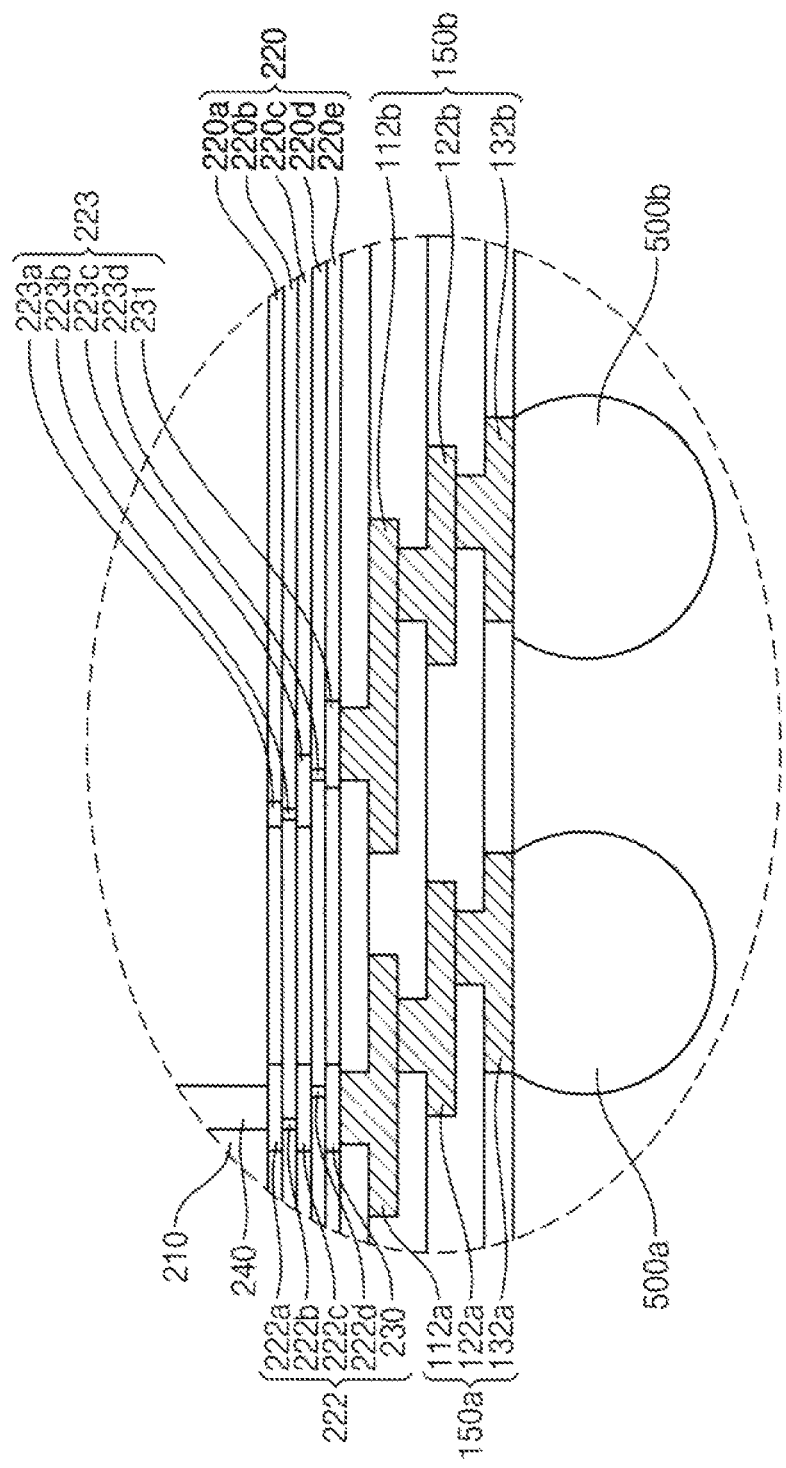

FIG. 1 is a cross-sectional view illustrating a semiconductor package in accordance with example embodiments. FIG. 2 is an enlarged cross-sectional view illustrating portion 'A' in FIG. 1.

Referring to FIGS. 1 and 2, a semiconductor package 10 may include a redistribution wiring layer 100, a first semiconductor chip 200, a second semiconductor chip 300 and a molding member (e.g., an insulating molding structure) 600. Additionally, the semiconductor package 10 may further include conductive bumps 360 for electrical connection between the first and second semiconductor chips 200, 300 and outer connection members 500 for electrical connection with an external device.

In example embodiments, the semiconductor package 10 may include the first semiconductor chip 200 and the redistribution wiring layer 100 on (e.g., covering) a first surface of the first semiconductor chip 200 to be provided as a Fan-In Wafer Level Package (Fan-In WLP). The redistribution wiring layer 100 may be formed on the first surface of the first semiconductor chip 200 by a wafer-level redistribution wiring process. Additionally, the semiconductor package 10 may be provided as a stack package including the stacked first and second semiconductor chips 200, 300.

Additionally, the semiconductor package 10 may be provided as a System In Package (SIP). For example, the first semiconductor chip 200 may be a logic chip including logic circuits and the second semiconductor chip 300 may be a memory chip. The logic chip may be a controller to control the memory chip. The memory chip may include various memory circuits such as DRAM, SRAM, flash, PRAM, ReRAM, FeRAM, MRAM, or the like.

The first semiconductor chip 200 may include a first substrate 210, an insulation interlayer 220, a first chip pad 230, a second chip pad 231, a third chip pad 250 and a through electrode 240.

The first substrate 210 may include a first surface and a second surface opposite to each other. The first surface may be an active surface, and the second surface may be a non-active (i.e., inactive) surface. Circuit patterns (not illustrated) may be provided in the first surface of the first substrate 210. The circuit patterns may include a transistor, a diode, etc. The circuit patterns may constitute circuit elements. Accordingly, the first semiconductor chip 200 may be a semiconductor device including a plurality of the circuit elements formed therein.

The insulation interlayer 220 may be provided on the first surface of the first substrate 210. The insulation interlayer 220 may include a plurality of insulation layers 220a, 220b, 220c, 220d, 220e and a first wiring 222 and a second wiring 223 in the insulation layers. The first chip pad 230 and the second chip pad 231 may each be provided in the outermost insulation layer of the insulation interlayer 220.

In particular, the first wiring 222 may include a first metal wiring 222a, a first contact 222b, a second metal wiring 222c, a second contact 222d, and a third metal wiring 230 respectively provided in the insulation layers 220a, 220b, 220c, 220d, 220e. At least a portion of the third metal wiring 230 may serve as the first chip pad as a landing pad.

The second wiring 223 may include a fourth metal wiring 223a, a fourth contact 223b, a fifth metal wiring 223c, a fifth contact 223d and a sixth metal wiring 231 respectively provided in the insulation layers 220a, 220b, 220c, 220d, 220e. At least a portion of the sixth metal wiring 231 may serve as the second chip pad as a landing pad. A circuit element in the first substrate 210 may be electrically connected to the second chip pad 231 through the second wiring 223.

It may be understood that the number of the metal wiring layers of the insulation interlayer 220 is not limited thereto. The insulation interlayer 220 as a BEOL (back end of line) metal wiring layer may include three or more metal wiring layers.

The through electrode (through silicon via, TSV) 240 may extend from the first surface to the second surface of the first substrate 210 in (e.g., to penetrate through) the first substrate 210. An end portion of the through electrode 240 may make contact with the first metal wiring 222a of the insulation interlayer 220. However, it may not be limited thereto, and for example, the through electrode 240 may penetrate through the insulation interlayer 220 to make contact with the first chip pad 230. The through electrode 240 may be electrically connected to the first chip pad 230 through the first wiring 222 of the insulation interlayer 220.

An insulation layer having the third chip pad 250 may be provided on the second surface of the first substrate 210, that is, the non-active surface. Another end portion of the through electrode 240 may make contact with the third chip pad 250.

The second semiconductor chip 300 may include a second substrate 310 and a chip pad 330. In some embodiments, the second semiconductor chip 300 may include an insulation interlayer on an active surface of the second substrate 310. For example, the chip pad 330 may be provided in an outermost insulation layer of the insulation interlayer.

Circuit patterns (not illustrated) may be provided in the active surface of the second substrate 310. The circuit patterns may include a transistor, a diode, etc. The circuit patterns may constitute circuit elements. The chip pad 330 may be electrically connected to a circuit element by a wiring in the insulation interlayer.

In example embodiments, the second semiconductor chip 300 may be stacked on the first semiconductor chip 200 via the conductive bumps 360. The second semiconductor chip 300 may be arranged on the first semiconductor chip 200 such that the chip pad 330 of the second semiconductor chip 300 faces the third chip pad 250 of the first semiconductor chip 200.

The conductive bump 360 may be interposed between the second semiconductor chip 300 and the first semiconductor chip 200. The conductive bump 360 may electrically connect the third chip pad 250 of the first semiconductor chip 200 and the chip pad 330 of the second semiconductor chip 300. For example, the conductive bump may have a diameter (e.g., in a horizontal direction and/or a vertical direction) of 10 micrometers (μm) to 100 μm.

Thus, the second semiconductor chip 300 may be electrically connected to the through electrode 240 of the first semiconductor chip 200 through the conductive bump 360.

Although only some chip pads are illustrated in the figures, structures and arrangements of the chip pads are shown as examples, and may not be limited thereto.

In example embodiments, the redistribution wiring layer 100 may be arranged on (e.g., to cover) the first surface of the first semiconductor chip 200. The redistribution wiring layer 100 may include a first redistribution wiring line 150*a* electrically connected to the first chip pad 230 and a second redistribution wiring line 150*b* electrically connected to the second chip pad 231.

The outer connection members 500 may be disposed on package pads in an outer surface of the redistribution wiring layer 100. The outer connection members 500 may include a first outer connection member 500*a* electrically connected to the first redistribution wiring line 150*a* and a second outer connection member 500*b* electrically connected to the second redistribution wiring line 150*b*. For example, the outer connection member 500 may include a solder ball. The solder ball may have a diameter (e.g., in a horizontal direction and/or a vertical direction) of 300 μm to 500 μm.

In particular, the redistribution wiring layer 100 may include a first insulation layer 110 provided on the first surface of the semiconductor chip 200 and having first openings which expose the first and second chip pads 230, 231 respectively, and first redistribution wirings 112, at least portions of which make contact with the first and second chip pads 230, 231 through the first openings respectively.

For example, the first redistribution wiring may include aluminum (Al), copper (Cu), tin (Sn), nickel (Ni), gold (Au), platinum (Pt), or an alloy thereof.

The redistribution wiring layer 100 may include a second insulation layer 120 provided on the first insulation layer 110 and having second openings which expose the first redistribution wirings 112 respectively, and second redistribution wirings 122, at least portions of which make contact with the first redistribution wirings 112 through the second openings respectively.

The redistribution wiring layer 100 may include a third insulation layer 130 provided on the second insulation layer 120 and having third openings which expose the second redistribution wirings 122 respectively, and third redistribution wirings 132, at least portions of which make contact with the second redistribution wirings 122 through the third openings respectively. A portion of the third redistribution wiring 132 may serve as a landing pad, that is, the package pad on which the outer connection member 500 is disposed. In some embodiments, the redistribution wiring layer 100 may include a fourth insulation layer 140 on the third insulation layer 130 and on sidewalls of the third redistribution wirings 132.

It may be understood that the number, sizes, arrangements, etc. of the insulation layers and the redistribution wirings of the redistribution wiring layer are illustrated as examples, and thus, may not be limited thereto.

The first redistribution wiring line 150*a* may include first to third redistribution wirings 112*a*, 122*a*, 132*a* electrically connected to each other. The first redistribution wiring 112*a* of the first redistribution wiring line 150*a* may make contact with the first chip pad 230. A portion of the third redistribution wiring 132*a* of the first redistribution wiring line 150*a* may serve as a first landing pad, that is, a first package pad on which the first outer connection member 500*a* is disposed. Thus, the first outer connection member 500*a* may be electrically connected to the through electrode 240 through the first redistribution wiring line 150*a* of the redistribution wiring layer 100 and the first wiring 222.

The second redistribution wiring line 150*b* may include first to third redistribution wirings 112*b*, 122*b*, 132*b* electrically connected to each other. The first redistribution wiring 112*b* of the second redistribution wiring line 150*b* may make contact with the second chip pad 231. A portion of the third redistribution wiring 132*b* of the second redistribution wiring line 150*b* may serve as a second landing pad, that is, a second package pad on which the second outer connection member 500*b* is disposed. Thus, the second outer connection member 500*b* may be electrically connected to a circuit element in the substrate 210 through the second redistribution wiring line 150*b* of the redistribution wiring layer 100 and the second wiring 223.

Accordingly, the first redistribution wiring line 150*a* of the redistribution wiring layer 100 and the through electrode 240 of the first semiconductor chip 200 may serve as a first input/output signal line for the second semiconductor chip 300. The second redistribution wiring line 150*b* of the redistribution wiring layer 100 may serve as a second input/output signal line for the first semiconductor chip 200.

In example embodiments, the molding member 600 may be provided on (e.g., to cover) a side surface of the first semiconductor chip 200 and a side surface of the second semiconductor chip 300. The molding member 600 may extend (e.g., be underfilled) between the first semiconductor chip 200 and the second semiconductor chip 300. The molding member 600 may be provided on (e.g., to cover) a side surface of the redistribution wiring layer 100.

For example, the molding member may include an epoxy, a polyimide, or an acrylic material.

In example embodiments, an adhesive layer 610 may be further provided on an outer surface of the second semiconductor chip 300, that is, a second surface. The adhesive layer 610 may include an adhesive film such as a die attach film (DAF) or a non-conductive film (NCF). The molding member 600 may be provided on (e.g., to cover) a side surface of the adhesive layer 610.

As mentioned above, the semiconductor package 10 as the Fan-In Wafer Level Package may include the redistribution wiring layer 100 on (e.g., covering) the first surface of the first semiconductor chip 200. The semiconductor package 10 as the stack package may include the second semiconductor chip 300 stacked on the second surface of the first semiconductor chip 200. The first and second outer connection members 500a, 500b may be disposed on the package pads of the redistribution wiring layer 100 respectively.

The first outer connection member 500a may be electrically connected to the second semiconductor chip 300 through the first redistribution wiring line 150a of the redistribution wiring layer 100 and the through electrode 240 of the first semiconductor chip 200 as the first input/output signal line. The second outer connection member 500b may be electrically connected to the first semiconductor chip 200 through the second redistribution wiring line 150b of the redistribution wiring layer 100 as the second input/output signal line.

Thus, the semiconductor package 10 may provide the stack package of the first and second semiconductor chips 200, 300 stacked via the conductive bumps 360 to thereby realize high bandwidth and high density. Input/output signals may be input/output to/from the first and second semiconductor chips 200, 300 through the first and second input/output signal lines so that signal transmission lengths are shortened to thereby increase/optimize signal integrity (SI).

Further, the molding member 600 may be on (e.g., cover) the side surfaces of the redistribution wiring layer 100, the first semiconductor chip 200 and the second semiconductor chips 300, to thereby inhibit/prevent a crack from occurring during a package test process using the outer connection members 500 on the outer surface of the redistribution wiring layer 100.

Hereinafter, a method of manufacturing the semiconductor package in FIG. 1 will be explained.

Figure 3:
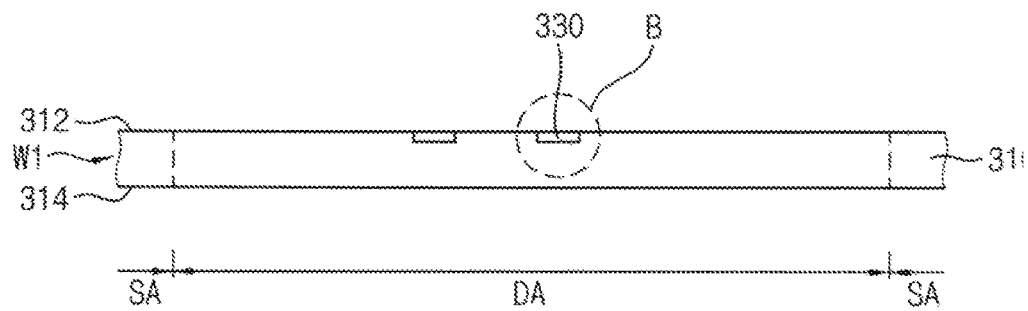

FIGS. 3 to 20 are cross-sectional views illustrating a method of manufacturing a semiconductor package in accordance with example embodiments. FIGS. 4 to 8 are enlarged views illustrating portion 'B' in FIG. 3. FIG. 12 is an enlarged view illustrating portion 'C' in FIG. 11. FIG. 16 is an enlarged view illustrating portion 'D' in FIG. 15.

Referring to FIGS. 3 to 10, bumps 32 may be formed on chip pads 330 of a second semiconductor chip.

First, the bumps 32 may be formed on the chip pads 330 of a first wafer W1 including the second semiconductor chip in a wafer level.

In example embodiments, the first wafer W1 may include a substrate 310 and the chip pads 330 provided in a first surface 312 of the substrate 310. In some embodiments, the first wafer W1 may include an insulation interlayer on an active surface of the substrate 310. For example, the chip pad 330 may be provided in an outermost insulation layer 332 of the insulation interlayer. The substrate 310 may include a die region DA where circuit patterns and cells are formed and a scribe lane region SA surrounding the die region DA. As described later herein, the substrate 310 of the first wafer W1 may be sawed along the scribe lane region SA dividing a plurality of the die regions DA.

For example, the substrate 310 may include may include silicon, germanium, silicon-germanium, or III-V compounds, e.g., gallium phosphide (GaP), gallium arsenide (GaAs), gallium antimonide (GaSb), etc. In some embodiments, the substrate 310 may be a silicon-on-insulator (SOI) substrate, or a germanium-on-insulator (GOI) substrate.

Circuit patterns (not illustrated) may be provided in the active surface of the substrate 310. The circuit patterns may include a transistor, a diode, etc. The circuit patterns may constitute circuit elements. The chip pad 330 may be electrically connected to the circuit element by a wiring in the insulation interlayer.

In example embodiments, the bumps 32 may be formed on the chip pad 330.

Figure 4:
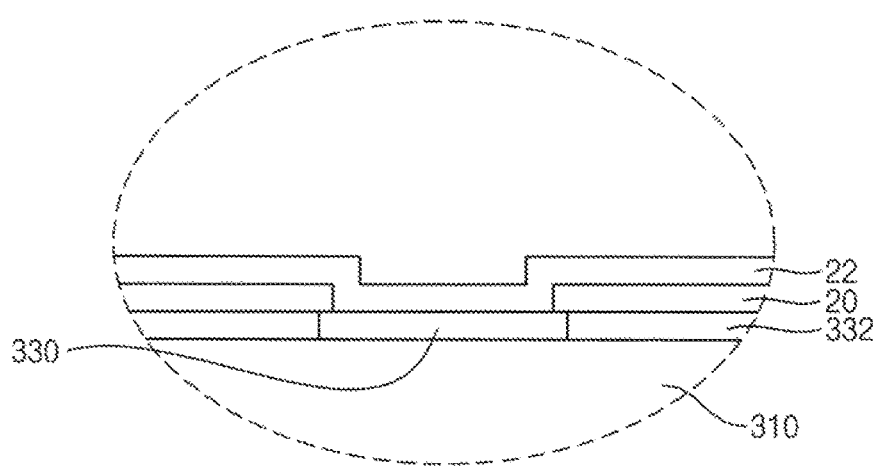

First, as illustrated in FIG. 4, an insulation layer pattern 20 may be formed on a front side 312 of the first wafer W1 (hereinafter, referred to as a first surface of the substrate 310 for simplicity of explanation) to expose the chip pad 330, and then, a seed layer 22 may be formed on the chip pad 330.

For example, the insulation layer pattern 20 may include oxide, nitride, etc. These may be used alone or in a mixture thereof. The insulation layer pattern 20 may be formed by a chemical vapor deposition (CVD) process, a plasma enhanced chemical vapor deposition (PECVD) process, an atomic layer deposition (ALD) process, a lower pressure chemical vapor deposition (LPCVD) process, a sputtering process, etc. Alternatively, the insulation layer pattern 20 may include a polymer layer formed by a spin coating process or a spray process. In embodiments in which a protective layer pattern for exposing the chip pad 330 is formed on the first surface 312 of the substrate 310, the process of forming the insulation layer pattern may be omitted.

The seed layer 22 may include an alloy layer including titanium/copper (Ti/Cu), titanium/palladium (Ti/Pd), titanium/nickel (Ti/Ni), chrome/copper (Cr/Cu) or a combination thereof. The seed layer 22 may be formed by a sputtering process.

Figure 5:
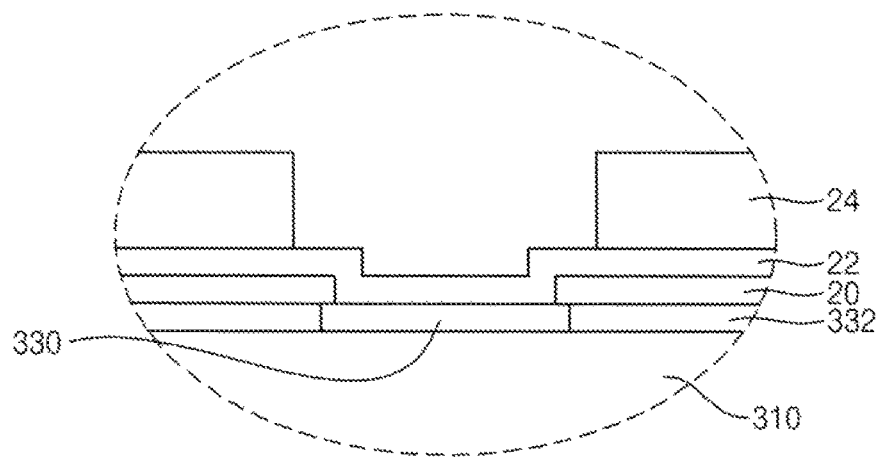
Figure 6:
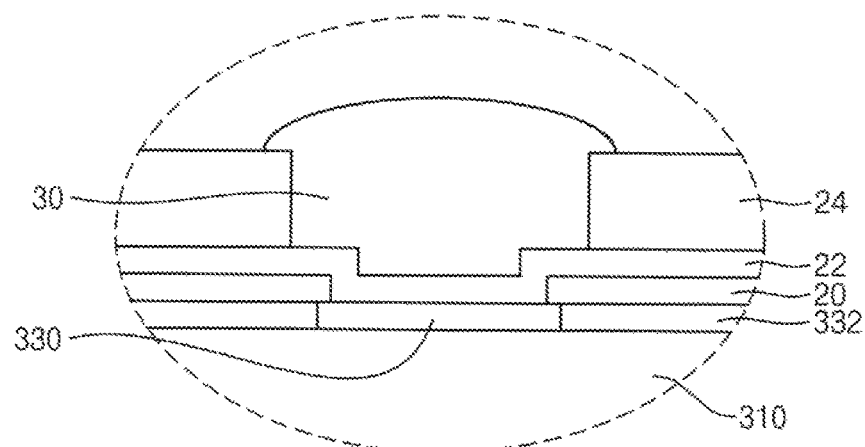
Figure 7:
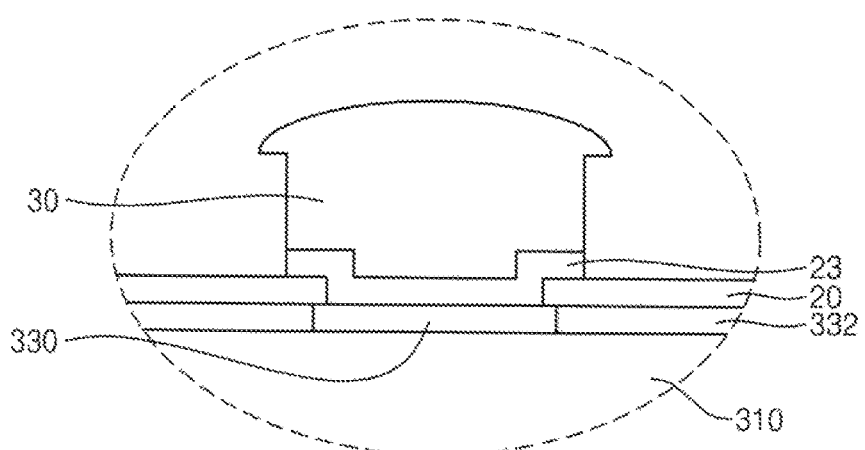
Figure 8:
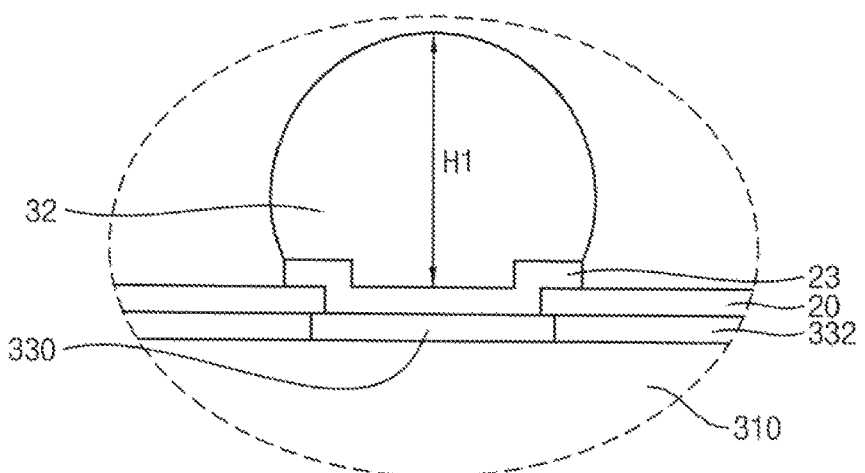
Figure 9:
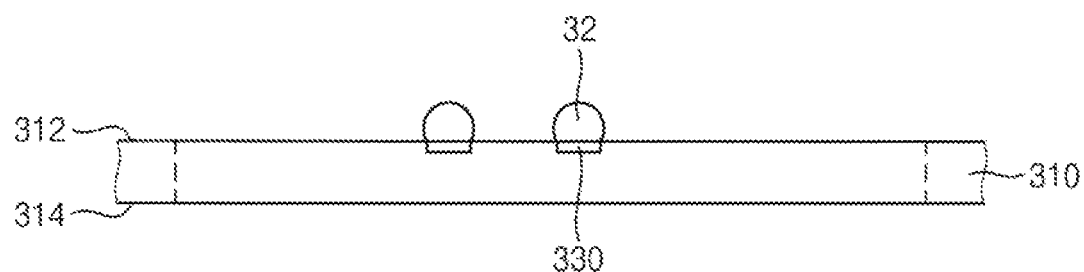

Then, as illustrated in FIG. 5, a photoresist pattern 24 having an opening which exposes a portion of the seed layer 22 may be formed on the first surface 312 of the substrate 310.

After a photoresist layer is formed on the first surface of the substrate 310 to cover the chip pad 330, an exposure process may be performed on the photoresist layer to form the photoresist pattern 24 having the opening exposing the region of the seed layer 22 on the chip pad 330.

As illustrated in FIGS. 6 to 9, the bump 32 may be formed on the chip pad 330 of the substrate 310.

In particular, a conductive material 30 may be formed to fill the opening of the photoresist pattern 24, the photoresist pattern 24 may be removed, and then, a reflow process may be performed to form the bump 32. For example, the conductive material 30 may be formed on the seed layer 22 by an electroplating process. Alternatively, the bump 32 may be formed by a screen printing process, a deposition process, etc. Portions of the seed layer 22 that are under the photoresist pattern 24 may be removed, thus providing a conductive pattern 23 under (e.g., contacting) the bump 32.

The bump 32 may have a first height H1 from the first surface of the substrate 310 (e.g., a height from a level of the insulation layer pattern 20). For example, the first height H1 of the bump 32 may range from 20 μm to 150 μm.

Figure 10:
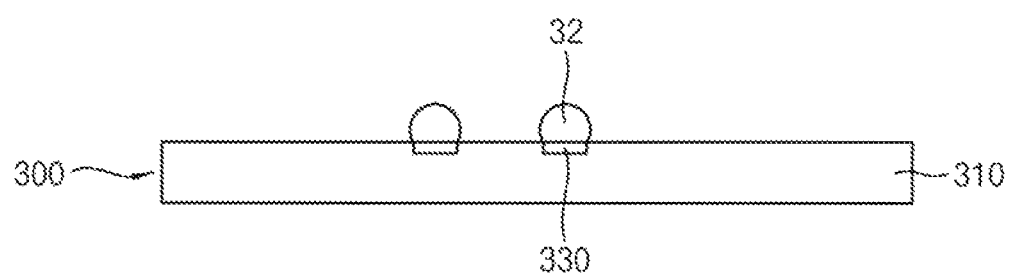

Referring to FIG. 10, the first wafer W1 may be sawed along the scribe lane region SA to form an individual second semiconductor chip 300.

Before performing the sawing process, a second surface 314 of the substrate 310 may be grinded.

Referring to FIGS. 11 to 17, a redistribution wiring layer 100 may be formed on a front side of a first semiconductor chip.

First, the redistribution wiring layer 100 having redistribution wirings electrically connected to chip pads 230, 231 may be formed on a front side 212 of a second wafer W2.

Figure 11:
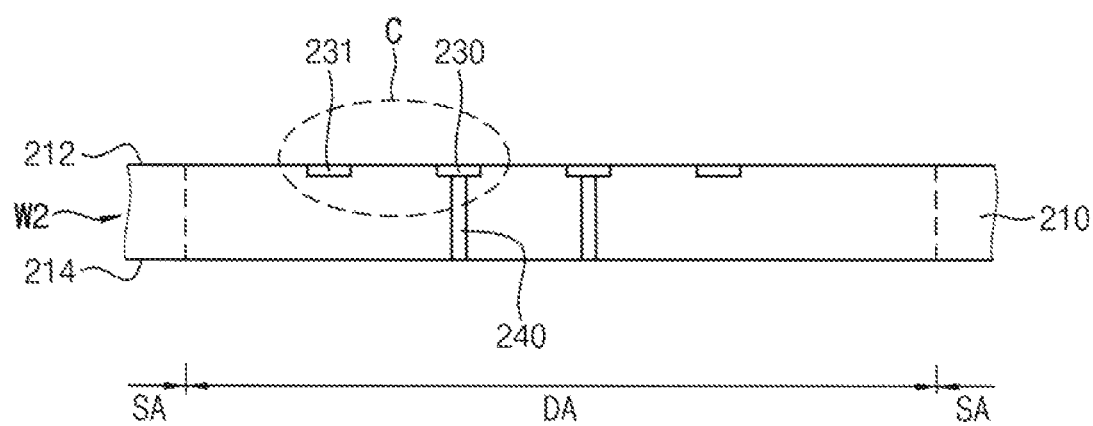
Figure 12:
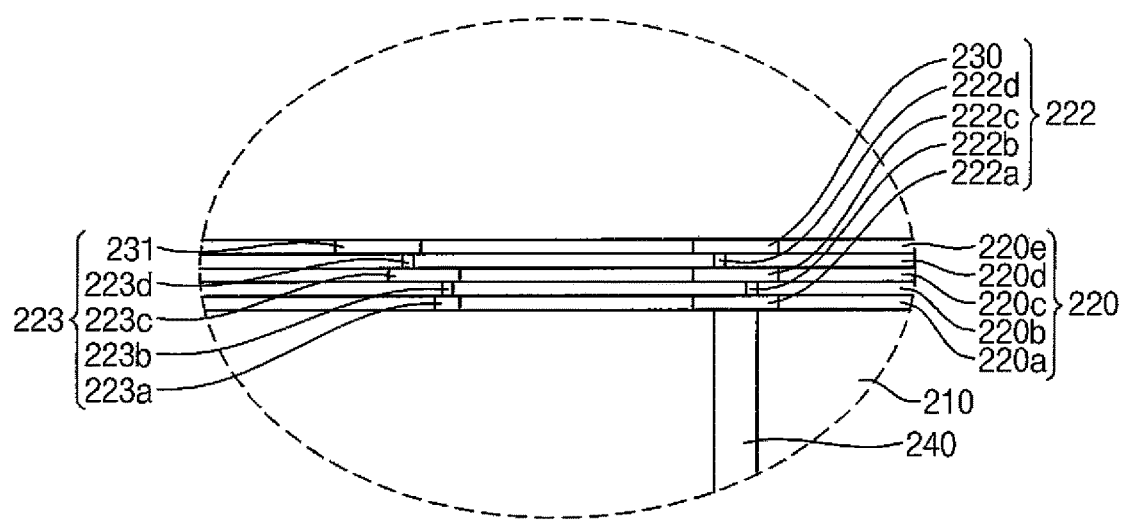

As illustrated in FIGS. 11 and 12, in example embodiments, the second wafer W2 may include a substrate 210, an insulation interlayer 220, a first chip pad 230, a second chip pad 231 and a through electrode 240. The insulation interlayer 220 may be provided on a first surface, that is, an active surface of the substrate 210. For example, the first and second chip pads 230, 231 may each be provided in an outermost insulation layer 220e of the insulation interlayer 220. The substrate 210 may include a die region DA where circuit patterns and cells are formed and a scribe lane region SA surrounding the die region DA. As described later, the substrate 210 of the second wafer W2 may be sawed along the scribe lane region SA dividing a plurality of the die regions DA.

Circuit patterns (not illustrated) may be provided in the active surface of the substrate 210. The circuit patterns may include a transistor, a diode, etc. The circuit patterns may constitute circuit elements. As described later, the second chip pad 231 may be electrically connected to the circuit element by a second wiring 223 in the insulation interlayer 220.

The insulation interlayer 220 may be provided on the active surface of the substrate 210. The insulation interlayer 220 may include a plurality of insulation layers 220a, 220b, 220c, 220d, 220e and a first wiring 222 and a second wiring 223 in the insulation layers.

The first wiring 222 may include a first metal wiring 222a, a first contact 222b, a second metal wiring 222c, a second contact 222d and a third metal wiring 230 respectively provided in the insulation layers 220a, 220b, 220c, 220d, 220e. At least a portion of the third metal wiring 230 may serve as the first chip pad as a landing pad. Accordingly, the first chip pad 230 may be provided in the front side 212 of the second wafer W2.

The second wiring 223 may include a fourth metal wiring 223a, a fourth contact 223b, a fifth metal wiring 223c, a fifth contact 223d and a sixth metal wiring 231 respectively provided in the insulation layers 220a, 220b, 220c, 220d, 220e. At least a portion of the sixth metal wiring 231 may serve as the second chip pad as a landing pad. Accordingly, the second chip pad 231 may be provided in the front side 212 of the second wafer W2. A circuit element in the substrate 210 may be electrically connected to the second chip pad 231 through the second wiring 223.

The through electrode 240 may be provided to penetrate through the substrate 210. An end portion of the through electrode 240 may make contact with the first metal wiring 222a of the insulation interlayer 220. However, it may not be limited thereto, and for example, the through electrode 240 may penetrate through the insulation interlayer 220 to make contact with the first chip pad 230.

Accordingly, the through electrode 240 may be electrically connected to the first chip pad 230 through the first wiring 222 of the insulation interlayer 220. The through electrode 240 may be formed before grinding a backside of the substrate 210, that is, a second surface (via first process, via middle process). Alternatively, the through electrode may be formed after grinding the backside of the substrate 210 (via last process).

Figure 13:
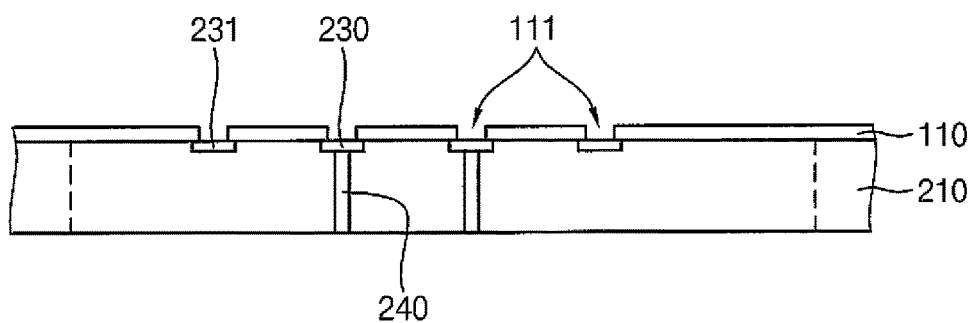

Referring to FIG. 13, a first insulation layer 110 may be formed on (e.g., to cover) the front side 212 of the second wafer W2, and then, the first insulation layer 110 may be patterned to form first openings 111 exposing the first and second chip pads 230, 231, respectively.

For example, the first insulation layer 110 may include polymer, a dielectric material, etc. The first insulation layer 110 may be formed by a spin coating process, a vapor deposition process, etc.

Figure 14:
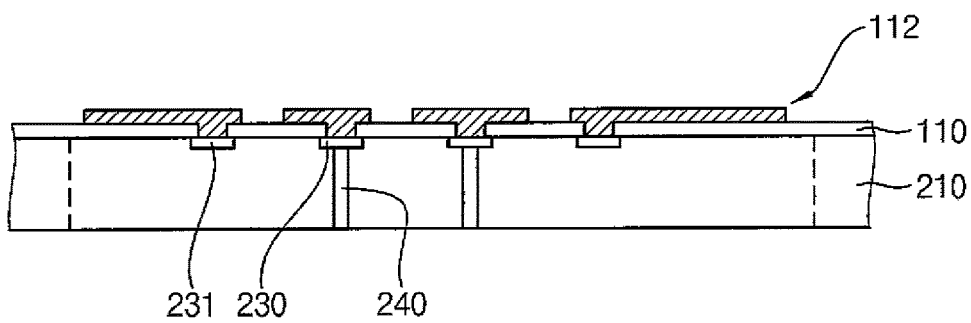

Referring to FIG. 14, first redistribution wirings 112 may be formed on the first insulation layer 110 to make contact with the first and second chip pads 230, 231 through the first openings 111, respectively.

In example embodiments, the first redistribution wiring 112 may be formed on a portion of the first insulation layer 110 and the first and second chip pads 230, 231. The first redistribution wiring 112 may be formed by forming a seed layer on the portion of the first insulation layer 110 and in the first opening 111, patterning the seed layer and performing an electroplating process. Accordingly, at least portions of the first redistribution wirings 112 may make contact with the first and second chip pad 230, 231 through the first openings 111, respectively.

For example, the first redistribution wiring 112 may include aluminum (Al), copper (Cu), tin (Sn), nickel (Ni), gold (Au), platinum (Pt), or an alloy thereof.

Figure 15:
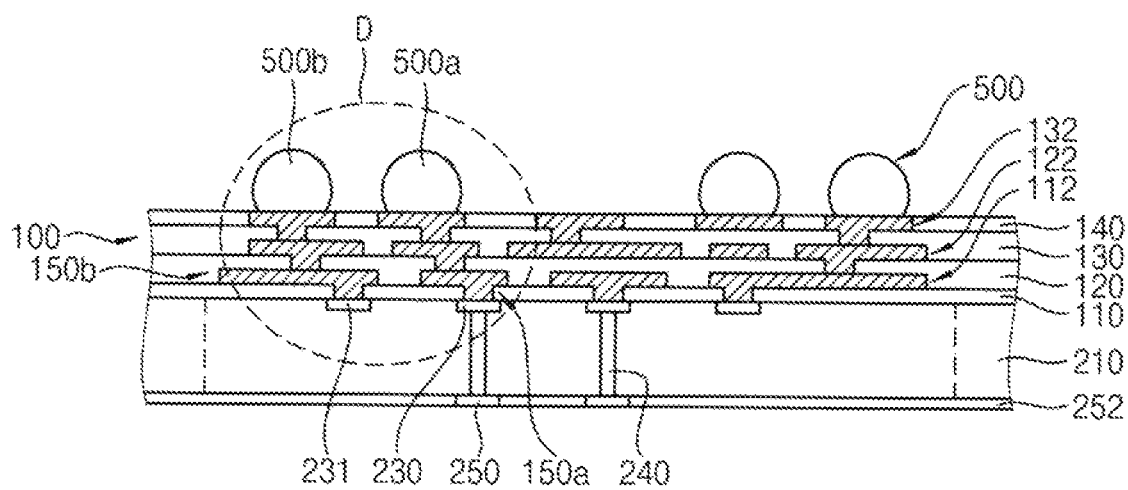
Figure 16:
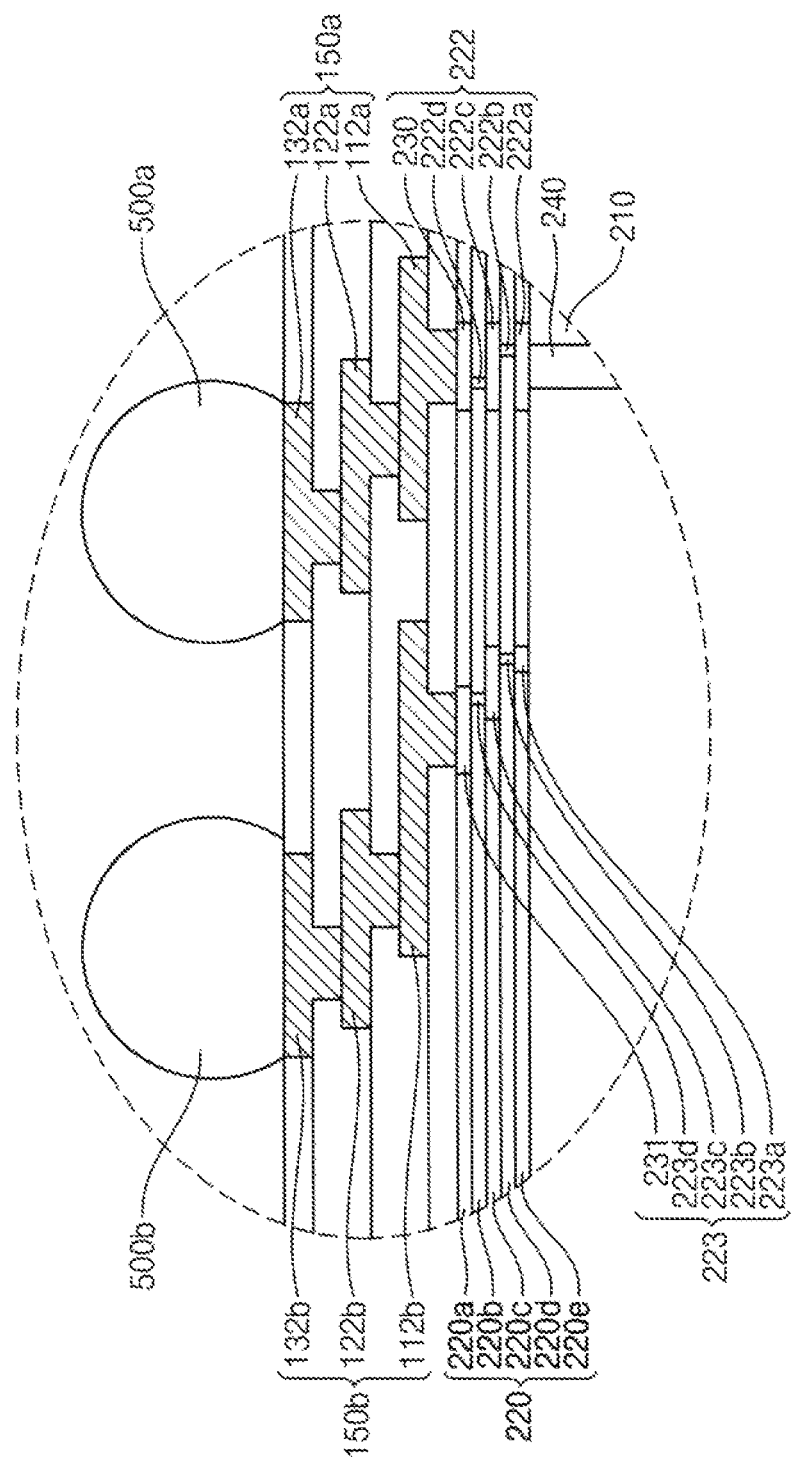

Referring to FIGS. 15 and 16, processes the same as or similar to the processes described with reference to FIGS. 13 and 14 may be performed to form the redistribution wiring layer 100 on the front side 212 of the second wafer W2, and then, outer connection members 500 may be formed on an outer surface of the redistribution wiring layer 100.

For example, a second insulation layer 120 may be formed on the first insulation layer 110 on (e.g., to cover) the first redistribution wirings 112, and then, second redistribution wirings 122 may be formed on the second insulation layer 120 to make contact with the first redistribution wirings 112 through second openings, respectively. A third insulation layer 130 may be formed on the second insulation layer 120 on (e.g., to cover) the second redistribution wirings 122, and then, third redistribution wirings 132 may be formed on the third insulation layer 130 to make contact with the second redistribution wirings 122 through third openings, respectively. A portion of the third redistribution wiring 132 may serve as a landing pad, that is, a package pad on which the outer connection member 500 is disposed. It may be understood that the number, sizes, arrangements, etc. of the insulation layers of the redistribution wiring layer 100 may not be limited thereto.

Then, the outer connection members 500 may be formed on the redistribution wiring layer 100 to be electrically connected to the redistribution wiring. For example, a solder ball as the outer connection member may be disposed on the portion of the third redistribution wiring 132. The outer connection members 500 may be formed on the package pads in the outer surface of the redistribution wiring layer 100 by a solder ball attaching process respectively. The solder ball may have a diameter of 300 μm to 500 μm.

As illustrated in FIG. 16, the redistribution wiring layer 100 may include a first redistribution wiring line 150a electrically connected to the first chip pad 230 and a second redistribution wiring line 150b electrically connected to the second chip pad 231. The outer connection members 500 may include a first outer connection member 500a electrically connected to the first redistribution wiring line 150a and a second outer connection member 500b electrically connected to the second redistribution wiring line 150b.

In particular, the first redistribution wiring line 150a may include first to third redistribution wirings 112a, 122a, 132a electrically connected to each other. The first redistribution wiring 112a of the first redistribution wiring line 150a may make contact with the first chip pad 230. A portion of the third redistribution wiring 132a of the first redistribution wiring line 150a may serve as a first landing pad, that is, a first package pad on which the first outer connection member 500a is disposed. Thus, the first outer connection member 500a may be electrically connected to the through electrode 240 through the first redistribution wiring line 150a of the redistribution wiring layer 100 and the first wiring 222.

The second redistribution wiring line 150b may include first to third redistribution wirings 112b, 122b, 132b electrically connected to each other. The first redistribution wiring 112b of the second redistribution wiring line 150b may make contact with the second chip pad 231. A portion of the third redistribution wiring 132b of the second redistribution wiring line 150b may serve as a second landing pad, that is, a second package pad on which the second outer connection member 500b is disposed. Thus, the second outer connection member 500b may be electrically connected to a circuit element in the substrate 210 through the second redistribution wiring line 150b of the redistribution wiring layer 100 and the second wiring 223.

In example embodiments, after forming the redistribution wiring layer 100, a process of forming an insulation layer 252 having a third chip pad 250 may be performed. The insulation layer 252 having the third chip pad 250 may be provided on a second surface of the substrate 210, that is, a non-active (i.e., inactive) surface. Another end portion of the through electrode 240 may make contact with the third chip pad 250. Alternatively, the process of forming the third chip pad 250 may be performed before forming the redistribution wiring layer 100.

Additionally, before forming the third chip pad 250, a process of grinding a backside of the second wafer W2 may be performed. The grinding process may be performed before or after forming the through electrode 240.

Figure 17:
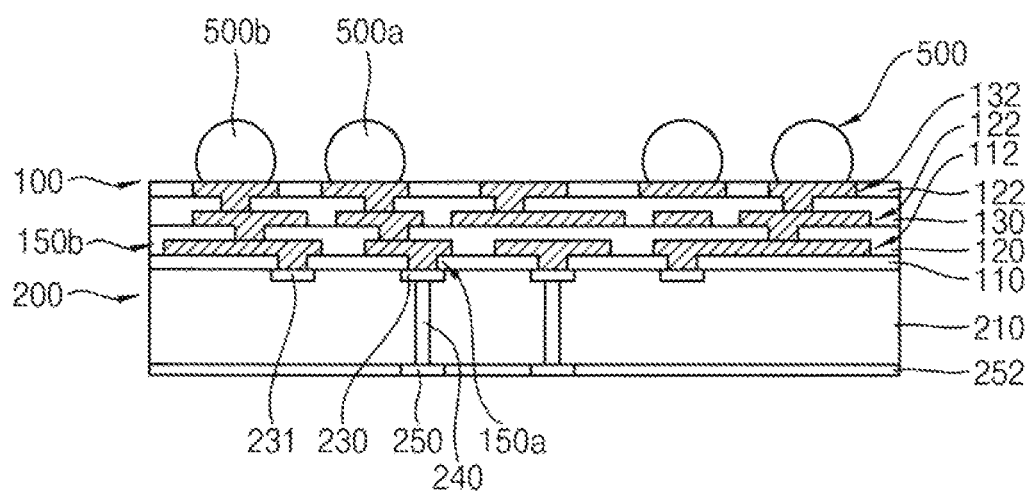

Referring to FIG. 17, the second wafer W2 may be sawed along the scribe lane region SA to form an individual first semiconductor chip 200.

Figure 18:
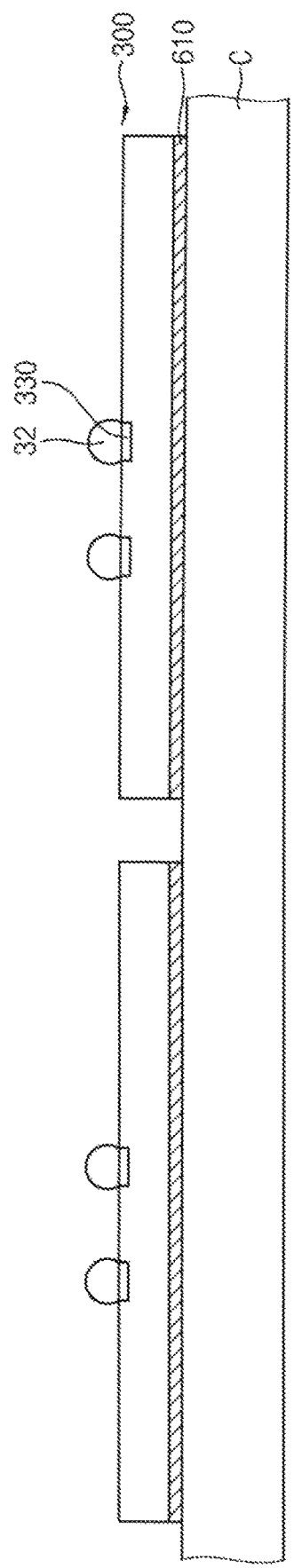
Figure 19:
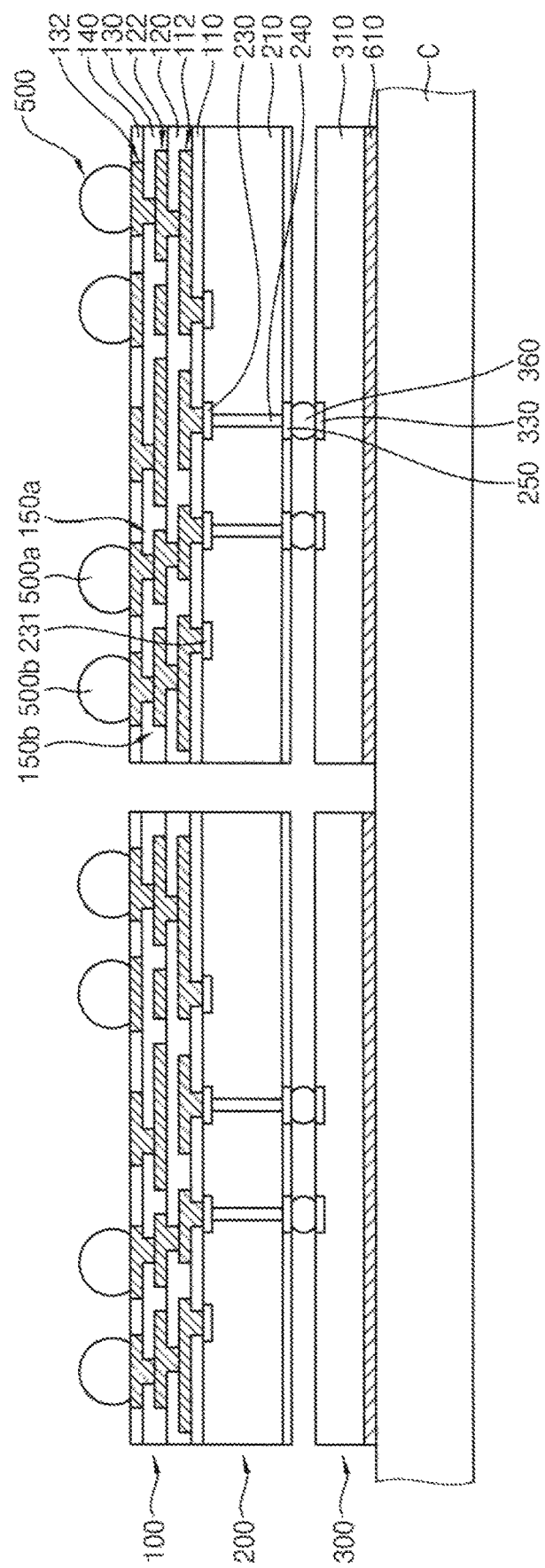

Referring to FIGS. 18 and 19, the first semiconductor chip 200 may be stacked on the second semiconductor chip 300.

First, as illustrated in FIG. 18, the second semiconductor chip 300 may be adhered on a carrier substrate C using an adhesive layer 610. The second semiconductor chip 300 may be adhered on the carrier substrate C such that the first surface of the second semiconductor chip 300 having the bumps 32 formed thereon faces up. The adhesive layer 610 may include an adhesive film such as a die attach film (DAF) or a non-conductive film (NCF).

Then, as illustrated in FIG. 19, the first semiconductor chip 200 may be stacked on the second semiconductor chip 300. The first semiconductor chip 200 may be stacked on the second semiconductor chip 300 such that the second surface of the first semiconductor chip 200 having the third chip pads 250 formed thereon faces the first surface of the second semiconductor chip 300. Then, the bumps 32 between the first semiconductor chip 200 and the second semiconductor chip 300 may be reflowed to form conductive bumps 360. For example, the conductive bump 360 may have a diameter of 10 μm to 100 μm.

The conductive bump 360 may be interposed between the second semiconductor chip 300 and the first semiconductor chip 200. The conductive bump 360 may electrically connect the chip pad 330 of the second semiconductor chip 300 and the third chip pad 250 of the first semiconductor chip 200. Thus, the second semiconductor chip 300 may be electrically connected to the first outer connection member 500a through the conductive bump 360, the through electrode 240 of the first semiconductor chip 200 and the first redistribution wiring line 150a.

Figure 20:
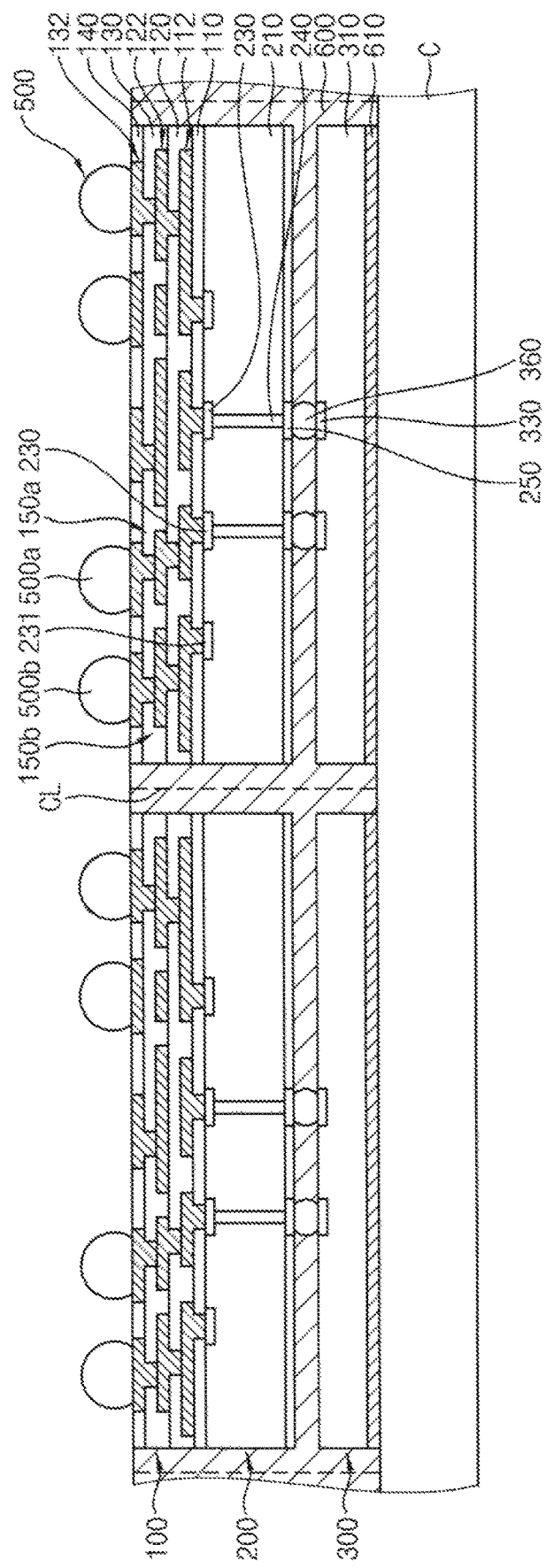

Referring to FIG. 20, a molding member 600 may be formed on the carrier substrate C to cover the first and second semiconductor chips 200, 300.

The molding member 600 may be formed between the first semiconductor chips 200, between the second semiconductor chips 300 and between the first and second semiconductor chips 200, 300. Additionally, the molding member 600 may be on (e.g., may cover) a side surface of the redistribution wiring layer 100. In some embodiments, the molding member 600 may expose (i.e., may be absent from) the outer surface of the redistribution wiring layer 100 in which the package pads are formed.

The molding member 600 may be formed by a dispensing process, a screen printing process, a spin coating process, etc. The molding member 600 may include an epoxy, a polyimide, or an acrylic material.

Then, the molding member 600 may be cut along a cutting line CL, to form the semiconductor package 10 in FIG. 1. The molding member 600 may be cut by a laser cutting process, a blade cutting process, etc.

In example embodiments, an electrical test process may be performed on the stacked first and second semiconductor chips 200, 300 using the outer connection members 500. Because the redistribution wiring layer 100 and the stacked first and second semiconductor chips 200, 300 are covered and supported by the molding member 600, cracks may be inhibited/prevented from occurring during the test process.

Figure 21:
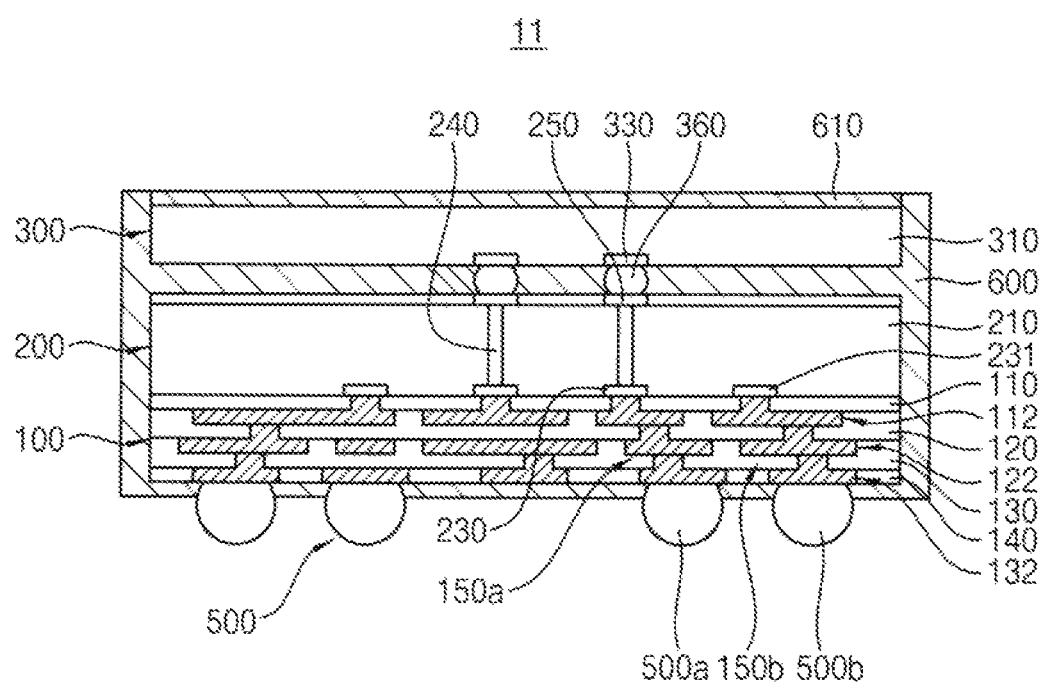

FIG. 21 is a cross-sectional view illustrating a semiconductor package in accordance with example embodiments. The semiconductor package may be substantially the same as or similar to the semiconductor package described with reference to FIG. 1 except for a molding member. Thus, the same reference numerals will be used to refer to the same or like elements and any further repetitive explanation concerning the above elements may be omitted.

Referring to FIG. 21, a molding member 600 of a semiconductor package 11 may be on (e.g., may cover) an outer surface of a redistribution wiring layer 100. Outer connection members 500 on package pads of the redistribution wiring layer 100 may be exposed by the molding member 600.

The molding member 600 may be provided to cover a side surface of a first semiconductor chip 200, a side surface of a second semiconductor chip 300 and a side surface and the outer surface of the redistribution wiring layer 100. The molding member 600 may be underfilled between the first semiconductor chip 200 and the second semiconductor chip 300.

Thus, as the semiconductor package 11 may be covered completely by the molding member 600 and an adhesive layer 610, the semiconductor package 11 may be more reliably protected from external impacts, moisture, etc.

Hereinafter, a method of manufacturing the semiconductor package in FIG. 21 will be explained.

Figure 22:
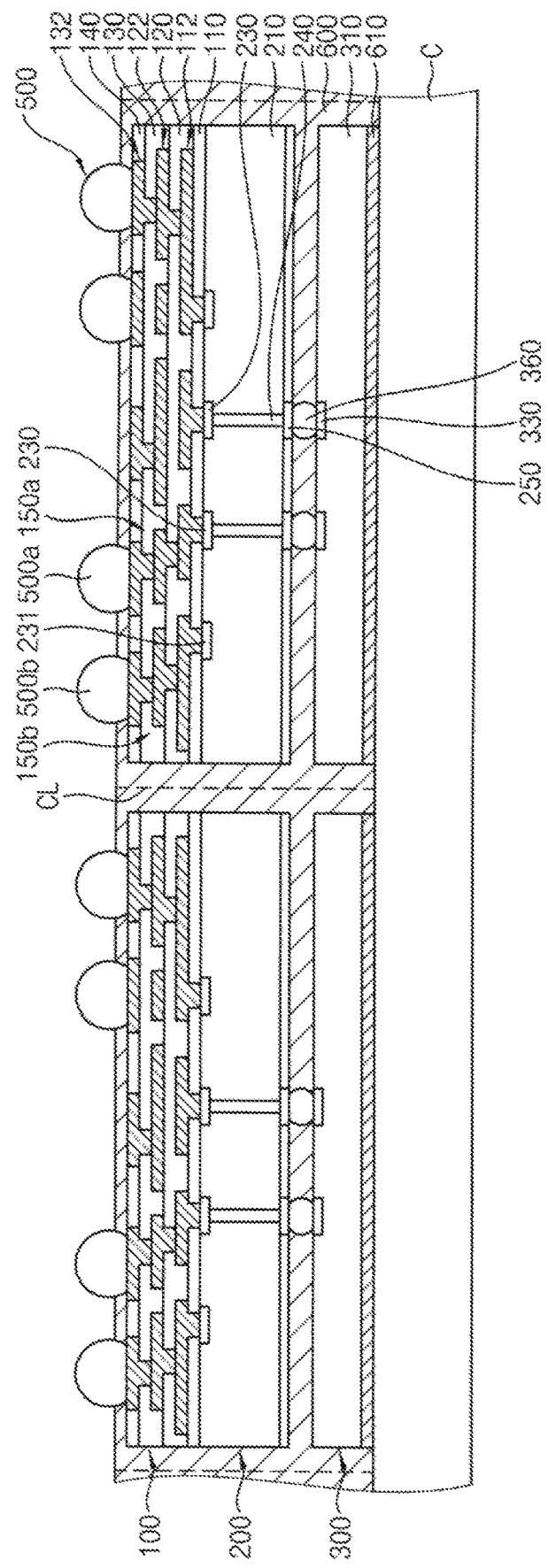

FIG. 22 is a cross-sectional view illustrating a method of manufacturing a semiconductor package in accordance with example embodiments.

Referring to FIG. 22, first, processes the same as or similar to the processes described with reference to FIGS. 3 to 19 may be performed to stack a first semiconductor chip 200 on a third semiconductor chip 300, and then, a molding member 600 may be formed on a carrier substrate C to cover the first and second semiconductor chips 200, 300.

The molding member 600 may be formed between the first semiconductor chips 200, between the second semiconductor chips 300 and between the first and second semiconductor chips 200, 300. Additionally, the molding member 600 may cover a side surface of the redistribution wiring layer 100. In some embodiments, the molding member 600 may expose an outer surface of a redistribution wiring layer 100 while exposing outer connection members 500.

Then, the molding member 600 may be cut along a cutting line CL, to form the semiconductor package 11 in FIG. 21.

Figure 23:
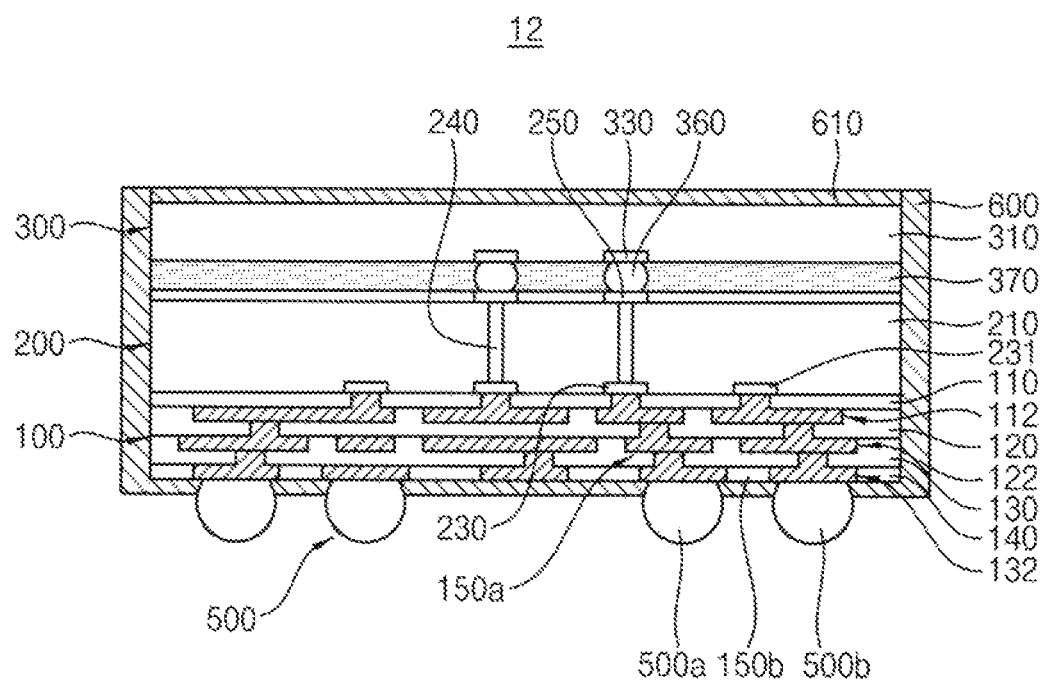

FIG. 23 is a cross-sectional view illustrating a semiconductor package in accordance with example embodiments. The semiconductor package may be substantially the same as or similar to the semiconductor package described with reference to FIG. 21 except for an additional adhesive layer between first and second semiconductor chips. Thus, the same reference numerals will be used to refer to the same or like elements and any further repetitive explanation concerning the above elements may be omitted.

Referring to FIG. 23, a semiconductor package 12 may further include an adhesive layer 370 between a first semiconductor chip 200 and a third semiconductor chip 300 to adhering the first and second semiconductor chips 200, 300 to each other.

The adhesive layer may be interposed between the first semiconductor chip 200 and the second semiconductor chip 300. For example, the adhesive layer 370 may include a non-conductive film (NCF). A bump on a third chip pad 250 may be thermally compressed and reflowed by a chip bonding apparatus to form a conductive bump 360, and the first semiconductor chip 200 and the third semiconductor chip 300 may be adhered to each other by the adhesive layer 370.

Hereinafter, a method of manufacturing the semiconductor package in FIG. 23 will be explained.

Figure 24:
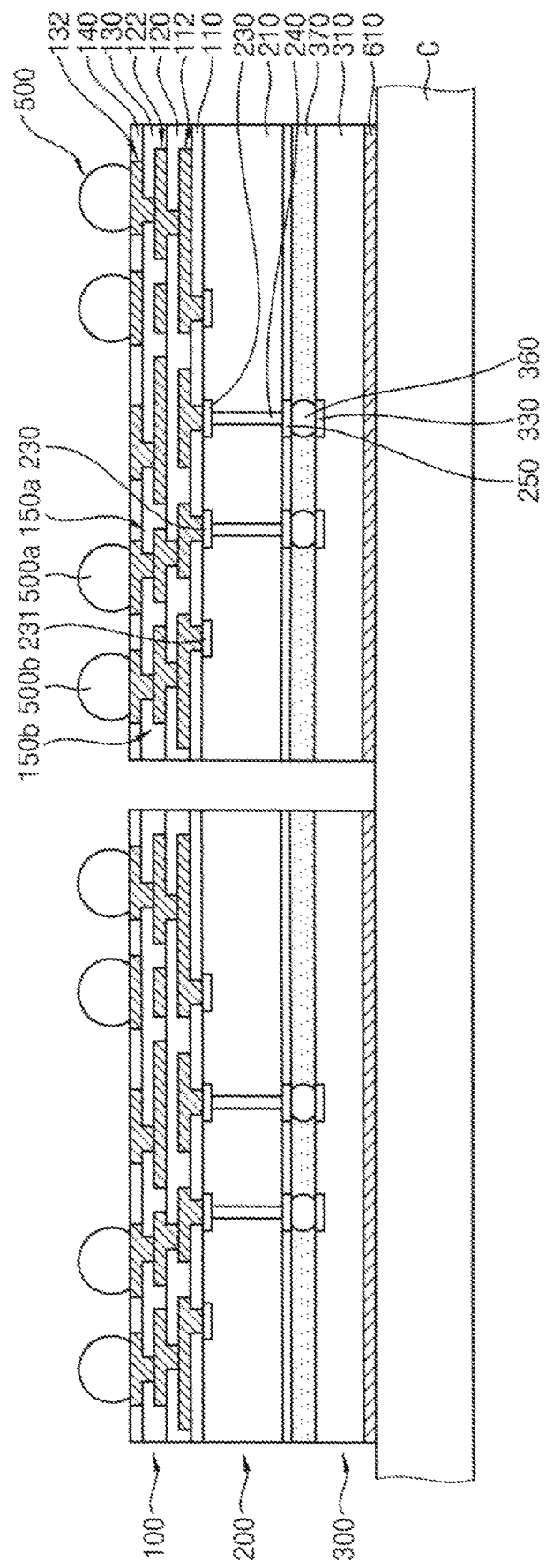

FIG. 24 is a cross-sectional view illustrating a method of manufacturing a semiconductor package in accordance with example embodiments.

Referring to FIG. 24, first, processes the same as or similar to the processes described with reference to FIGS. 3 to 18 may be performed, and then, a first semiconductor chip 200 may be adhered on a third semiconductor chip 300 using an adhesive layer 370.

In example embodiments, the adhesive layer 370 may be coated on a first surface of the second semiconductor chip 300 or a second surface of the first semiconductor chip 200, and then, the first semiconductor chip 200 may be adhered on the second semiconductor chip 300. The adhesive layer 370 may include a non-conductive film.

For example, the first semiconductor chip 200 may be suctioned by a head of a chip bonding apparatus and may be thermally compressed on the second semiconductor chip 300. The adhesive layer 370 may be heated and a bump may be reflowed to form a conductive bump 360 between a chip pad 330 and a third chip pad 250.

Then, processes the same as or similar to the processes described with reference to FIG. 22 may be performed to form a molding member 600 on a carrier substrate C, which covers the first and second semiconductor chips 200, 300, and then, the molding member 600 may be cut along a cutting line CL to form the semiconductor package 12 in FIG. 23.

Figure 25:
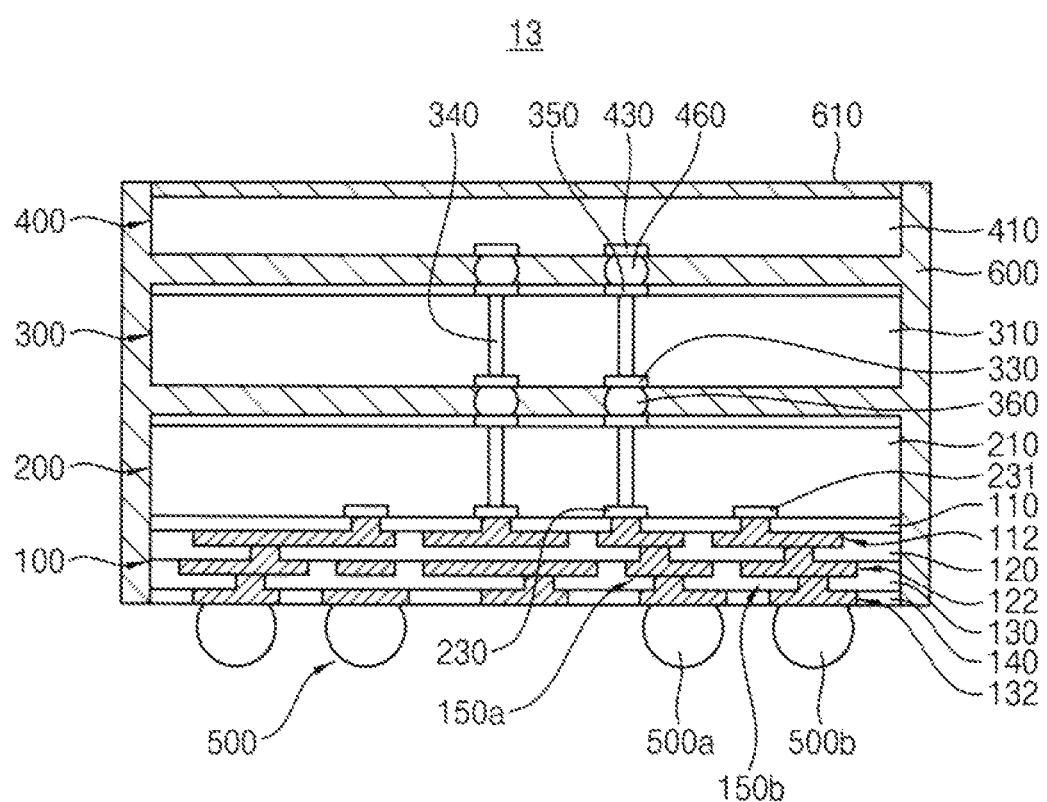

FIG. 25 is a cross-sectional view illustrating a semiconductor package in accordance with example embodiments. The semiconductor package may be substantially the same as or similar to the semiconductor package described with reference to FIG. 1 except for an additional third semiconductor chip. Thus, the same reference numerals will be used to refer to the same or like elements and any further repetitive explanation concerning the above elements may be omitted.

Referring to FIG. 25, a semiconductor package 13 may include a redistribution wiring layer 100, a first semiconductor chip 200, a second semiconductor chip 300, a third semiconductor chip 400 and a molding member 600. Additionally, the semiconductor package 13 may further include conductive bumps 360 for electrical connection between the first and second semiconductor chips 200, 300, second conductive bumps 460 for electrical connection between the second and third semiconductor chips 300, 400 and outer connection members 500 for electrical connection with an external device.

In example embodiments, the second semiconductor chip 300 may include a second substrate 310, a fourth chip pad 330, a fifth chip pad 350 and a through electrode 340. The third semiconductor chip 400 may include a third substrate 410 and a chip pad 430.

The second semiconductor chip 300 may be stacked on the first semiconductor chip 200 via the conductive bumps 360. The second semiconductor chip 300 may be arranged on the first semiconductor chip 200 such that the fourth chip pad 330 of the second semiconductor chip 300 faces the third chip pad 250 of the first semiconductor chip 200.

The third semiconductor chip 400 may be stacked on the second semiconductor chip 300 via the second conductive bumps 460. The third semiconductor chip 400 may be arranged on the second semiconductor chip 300 such that the chip pad 430 of the third semiconductor chip 400 faces the fifth chip pad 350 of the second semiconductor chip 300.

Although three semiconductor chips are illustrated in the figure, it may be understood that the number of the stacked semiconductor chips may not be limited thereto.

A first outer connection member 500a may be electrically connected to the third semiconductor chip 400 through a first redistribution wiring line 150a of the redistribution wiring layer 100, the through electrode 240 of the first semiconductor chip 200 and the through electrode 340 of the second semiconductor chip 300.

Hereinafter, a method of manufacturing the semiconductor package in FIG. 25 will be explained.

Figure 26:
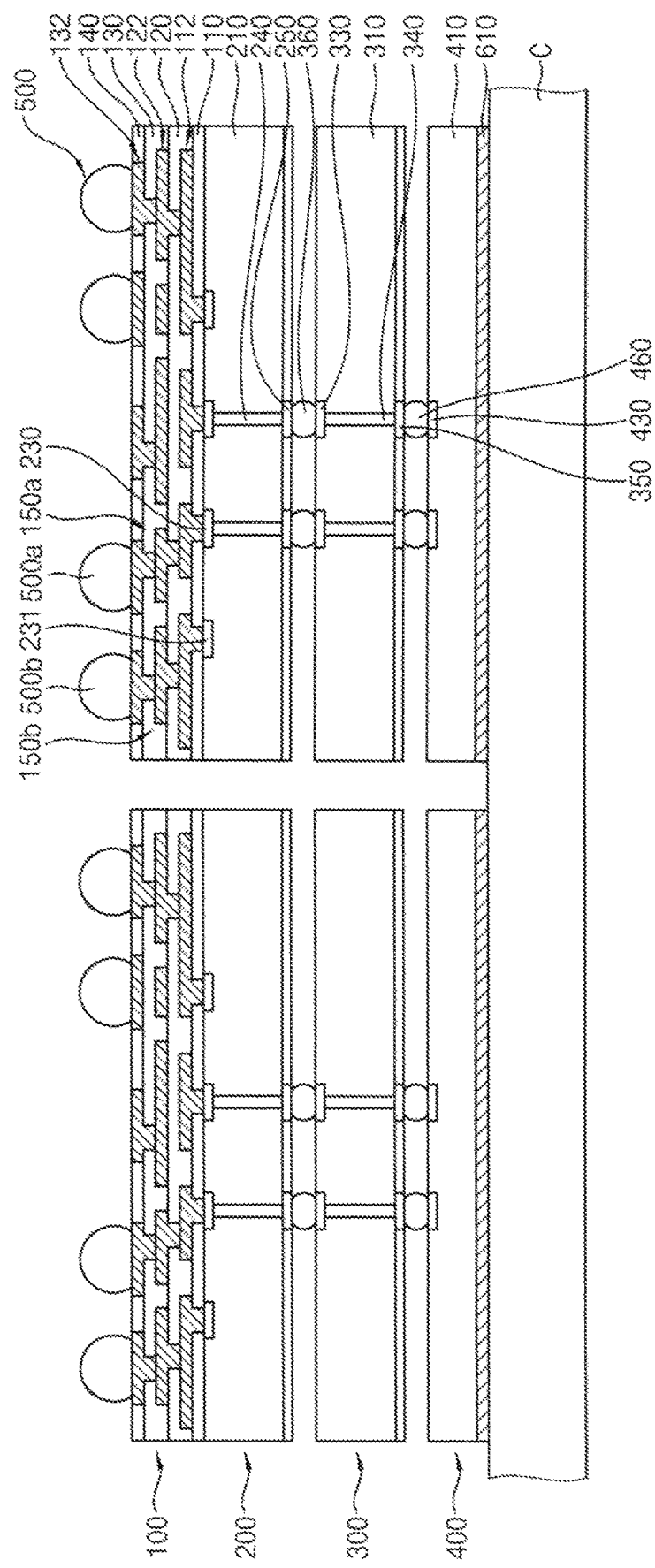

FIG. 26 is a cross-sectional view illustrating a method of manufacturing a semiconductor package in accordance with example embodiments.

Referring to FIG. 26, first, processes the same as or similar to the processes described with reference to FIGS. 3 to 18 may be performed to adhere a third semiconductor chip 400 on a carrier substrate S using an adhesive layer 610, and then, a second semiconductor chip 300 may be stacked on the third semiconductor chip 400 and a first semiconductor chip 200 may be stacked on the second semiconductor chip 300.

In example embodiments, the second semiconductor chip 300 may be stacked on the third semiconductor chip 400. The second semiconductor chip 300 may be stacked on the third semiconductor chip 400 such that a second surface of the second semiconductor chip 300 having fifth chip pads 350 formed thereon faces a first surface of the third semiconductor chip 400. Then, bumps between the second semiconductor chip 300 and the third semiconductor chip 400 may be reflowed to form second conductive bumps 460.

Then, the first semiconductor chip 200 may be stacked on the second semiconductor chip 300. The first semiconductor chip 200 may be stacked on the second semiconductor chip 300 such that a second surface of the first semiconductor chip 200 having third chip pads 250 formed thereon faces a first surface of the second semiconductor chip 300. Then, bumps between the first semiconductor chip 200 and the second semiconductor chip 300 may be reflowed to form conductive bumps 360.

Then, processes the same as or similar to the processes described with reference to FIG. 20 may be performed to form a molding member 600 on the carrier substrate C, which covers the first to third semiconductor chips 200, 300, 400, and then, the molding member 600 may be cut along a cutting line CL to form the semiconductor package 13 in FIG. 25.

Figure 27:
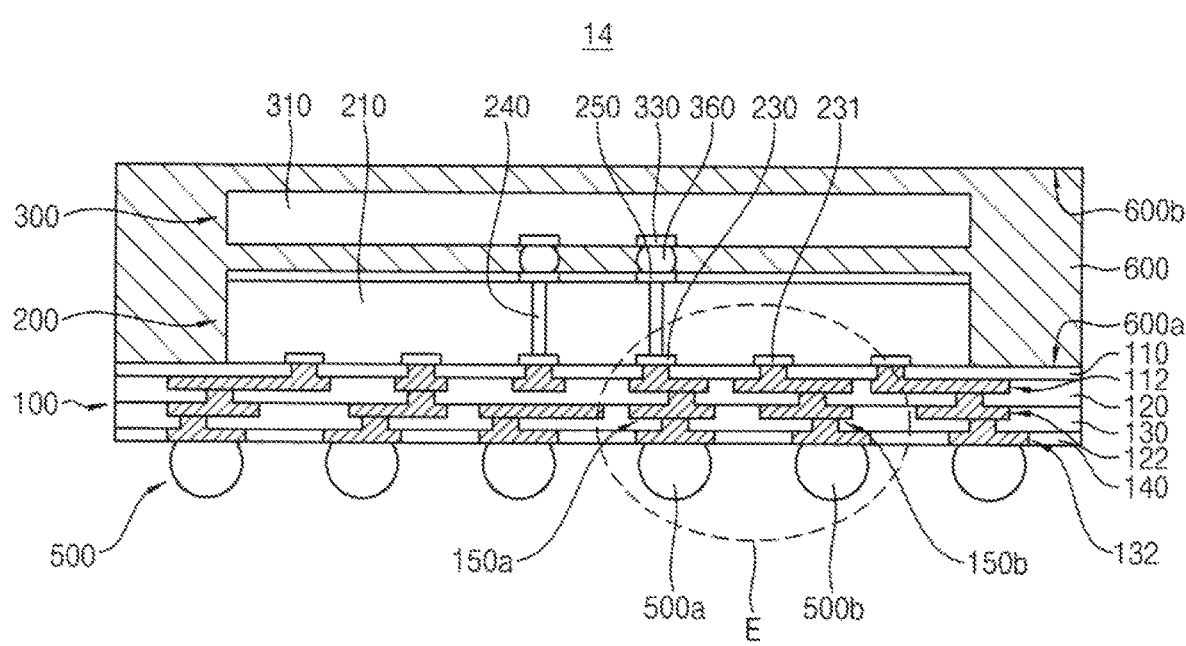
Figure 28:
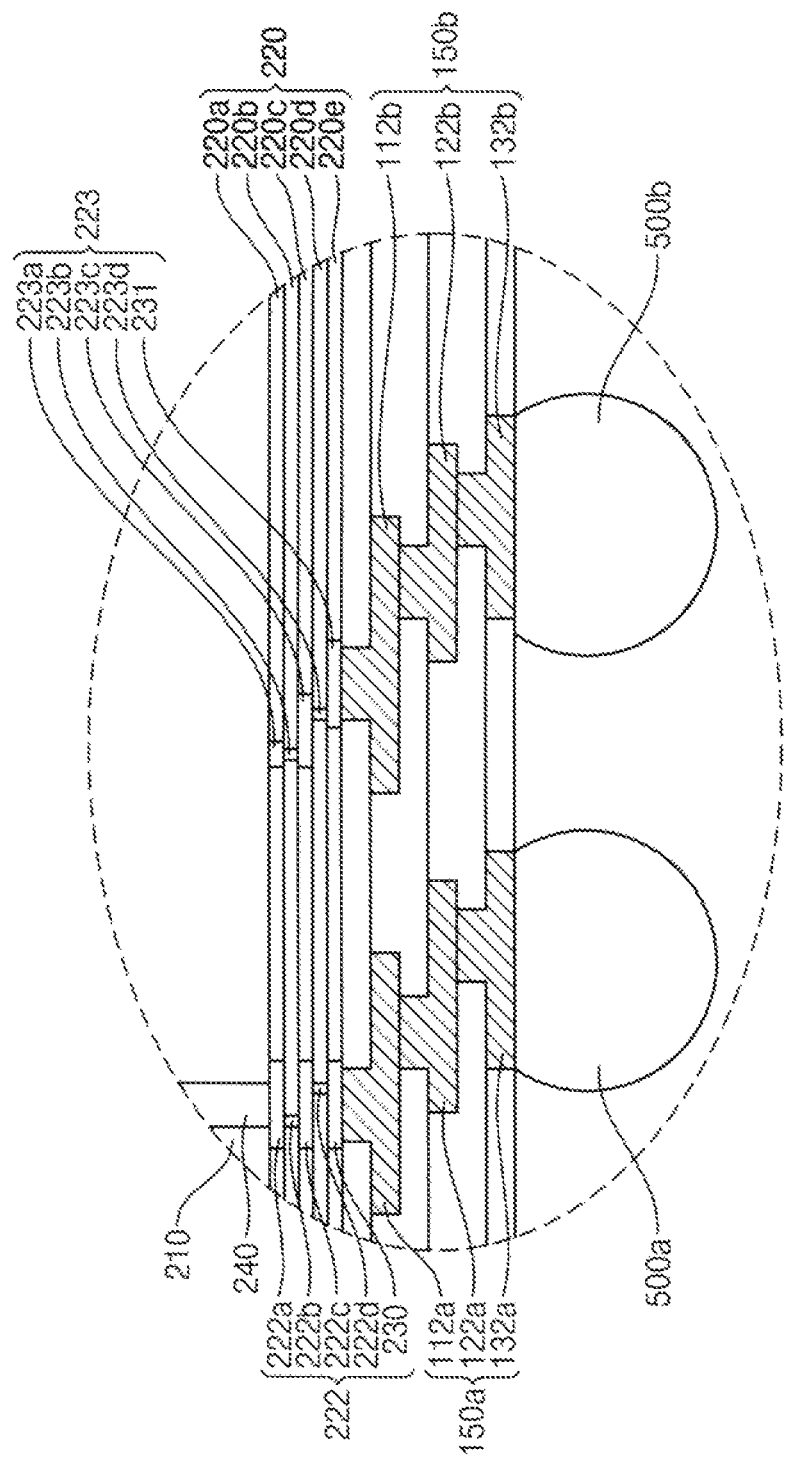

FIG. 27 is a cross-sectional view illustrating a semiconductor package in accordance with example embodiments. FIG. 28 is an enlarged cross-sectional view illustrating portion 'E' in FIG. 27. The semiconductor package may be substantially the same as or similar to the semiconductor package described with reference to FIG. 1 except that the semiconductor package includes a fan-out type of redistribution wiring layer. Thus, the same reference numerals will be used to refer to the same or like elements and any further repetitive explanation concerning the above elements may be omitted.

Referring to FIGS. 27 and 28, a semiconductor package 14 may include a molding member 600, first and second semiconductor chips 200, 300 arranged in the molding member 600, and a redistribution wiring layer 100 covering a first surface 600a of the molding member 600 and having redistribution wirings electrically connected to first and second chip pads 230, 231 of the first semiconductor chip 200. Additionally, the semiconductor package 14 may further include conductive bumps 360 for electrical connection between the first and second semiconductor chips 200, 300 and outer connection members 500 for electrical connection with an external device.

In example embodiments, the semiconductor package 14 may include the molding member 600 provided as a mold substrate and the redistribution wiring layer 100 formed on the first surface 600a of the molding member 600 to be provided as a Fan-Out Wafer Level Package (Fan-Out WLP). The redistribution wiring layer 100 may be formed on the first surface 600a of the molding member 600 by a wafer-level redistribution wiring process. Additionally, the semiconductor package 14 may be provided as a stack package including the stacked first and second semiconductor chips 200, 300.

In particular, the redistribution wiring layer 100 may cover a lower surface of the molding member 600, that is, the first surface 600a. The first semiconductor chip 200 may be received in the molding member 600 such that a first surface of the first semiconductor chip 200 having the first and second chip pads 230, 231 formed therein faces the redistribution wiring layer 100. The first surface of the first semiconductor chip 200 may be exposed by the first surface 600a of the molding member 600. Accordingly, the first and second chip pads 230, 231 of the first semiconductor chip 200 may be exposed by the first surface 600a of the mold substrate 600.

The second semiconductor chip 300 may be stacked on the first semiconductor chip 200 via the conductive bumps 360. The second semiconductor chip 300 may be arranged on the first semiconductor chip 200 such that a chip pad 330 of the second semiconductor chip 300 faces a third chip pad 250 of the first semiconductor chip 200.

The outer connection members 500 may be disposed on package pads in an outer surface of the redistribution wiring layer 100. The outer connection members 500 may include a first outer connection member 500a electrically connected to a first redistribution wiring line 150a and a second outer connection member 500b electrically connected to a second redistribution wiring line 150b. For example, the outer connection member 500 may include a solder ball.

The first redistribution wiring line 150a may include first to third redistribution wirings 112a, 122a, 132a electrically connected to each other. The first redistribution wiring 112a of the first redistribution wiring line 150a may make contact with the first chip pad 230. A portion of the third redistribution wiring 132a of the first redistribution wiring line 150a may serve as a first landing pad, that is, a first package pad on which the first outer connection member 500a is disposed. Thus, the first outer connection member 500a may be electrically connected to a through electrode 240 through the first redistribution wiring line 150a of the redistribution wiring layer 100 and a first wiring 222.

The second redistribution wiring line 150b may include first to third redistribution wirings 112b, 122b, 132b electrically connected to each other. The first redistribution wiring 112b of the second redistribution wiring line 150b may make contact with the second chip pad 231. A portion of the third redistribution wiring 132b of the second redistribution wiring line 150b may serve as a second landing pad, that is, a second package pad on which the second outer connection member 500b is disposed. Thus, the second outer connection member 500b may be electrically connected to a circuit element in a substrate 210 through the second redistribution wiring line 150b of the redistribution wiring layer 100 and a second wiring 223.

The first outer connection member 500a may be electrically connected to the second semiconductor chip 300 through the first redistribution wiring line 150a of the redistribution wiring layer 100 and the through electrode 240 of the first semiconductor chip 200 as a first input/output signal line. The second outer connection member 500b may be electrically connected to the first semiconductor chip 200 through the second redistribution wiring line 150b of the redistribution wiring layer 100 as a second input/output signal line.

Hereinafter, a method of manufacturing the semiconductor package in FIG. 27 will be explained.

FIGS. 29 to 34 are cross-sectional views illustrating a method of manufacturing a semiconductor package in accordance with example embodiments.

Figure 29:
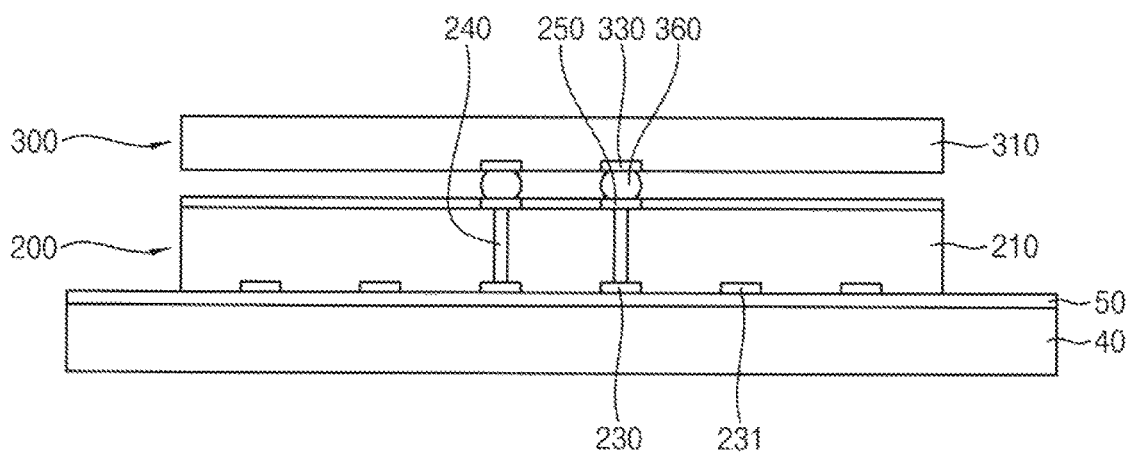

Referring to FIG. 29, first, a separation layer 50 may be formed on a dummy substrate 40, and then, first and second semiconductor chips 200, 300 may be sequentially stacked on the separation layer 50.

In example embodiments, the dummy substrate 40 may be used as a base substrate on which the first and second semiconductor chips 200, 300 are stacked and a mold substrate is to be formed to cover the first and second semiconductor chips 200, 300. The dummy substrate 40 may have a size corresponding to a wafer on which a semiconductor fabrication process is performed. The dummy substrate 40 may include, for example, a silicon substrate, a glass substrate, or a non-metal or metal plate.

The separation layer 50 may include a polymer tape acting as a temporary adhesive. The separation layer 50 may include a material that loses its adhesive strength when irradiated with light or heated. The separation layer 50 may include, for example, dual cure silicone adhesive that is cross-linkable by irradiation of ultraviolet ray or visible light.

The first semiconductor chip 200 may be disposed on the dummy substrate 40 such that a second surface of the first semiconductor chip 200 faces up, and then, the second semiconductor chip 300 may be stacked on the first semiconductor chip 200. The second semiconductor chip 300 may be stacked on the first semiconductor chip 300 such that a first surface of the second semiconductor chip 300 having chip pads 330 formed thereon faces the second surface of the first semiconductor chip 200.

Figure 30:
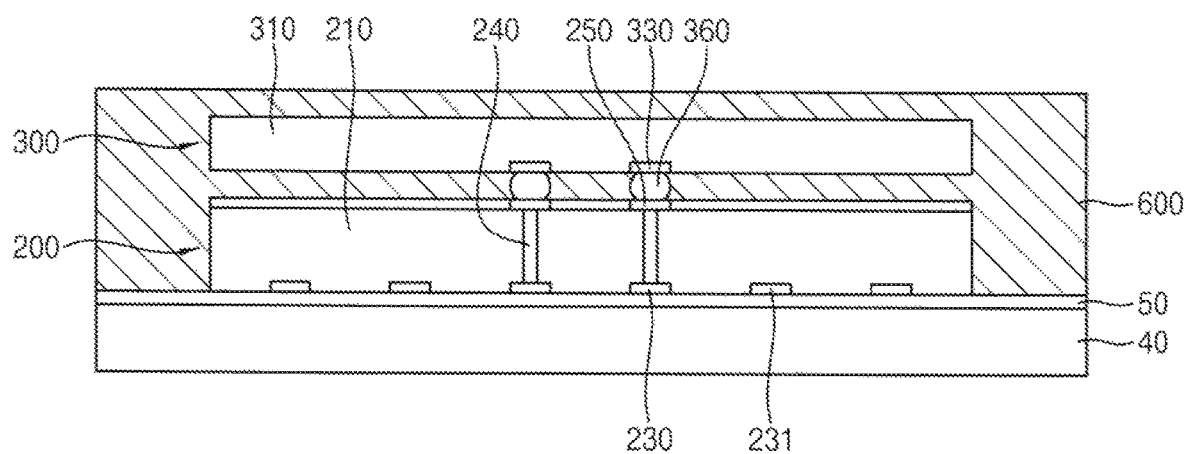

Referring to FIG. 30, a molding member 600 as a mold substrate may be formed on the dummy substrate 40 to cover the first and second semiconductor chips 200, 300.

In example embodiments, the molding member 600 covering the first and second semiconductor chips 200, 300 may be formed by forming a molding material on the separation layer 50 by a molding process.

The molding member 600 may be formed on a side surface of the first semiconductor chip 200 and a side surface of the second semiconductor chip 300 and between the first and second semiconductor chips 200, 300.

Figure 31:
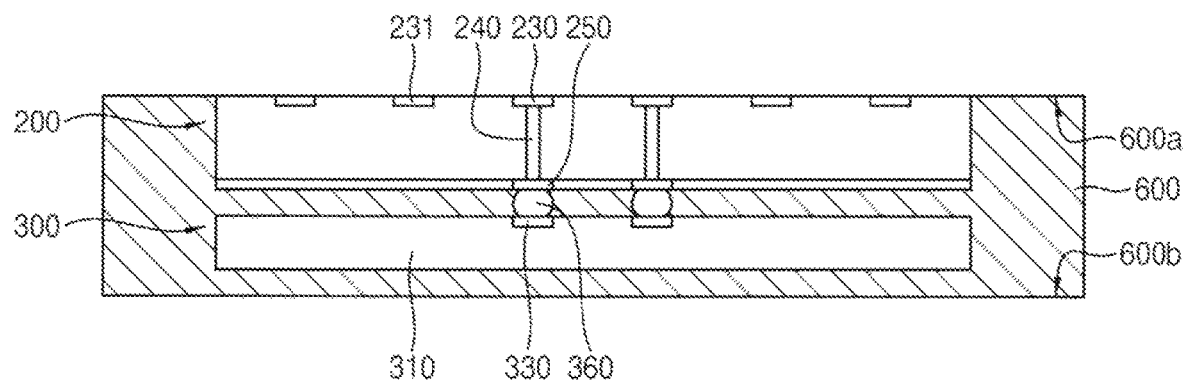

Referring to FIG. 31, the structure including the molding member 600 formed therein in FIG. 30 may be reversed (e.g., rotated/flipped), and then, the dummy substrate 40 and the separation layer 50 may be removed from the molding member 600.

In example embodiments, the separation layer 50 may be irradiated with light or may be heated to remove the dummy substrate 40 from the molding member 600. As the dummy substrate 40 is removed, the first surface of the first semiconductor chip 200 may be exposed by a first surface 600*a* of the molding member 600. Accordingly, first and second chip pads 230, 231 of the first semiconductor chip 200 may be exposed by the first surface 600*a* of the molding member 600.

Figure 32:
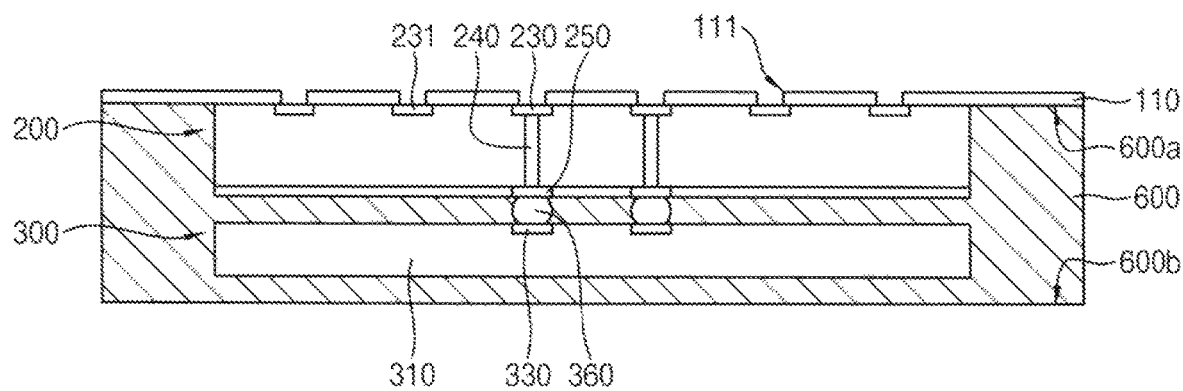
Figure 33:
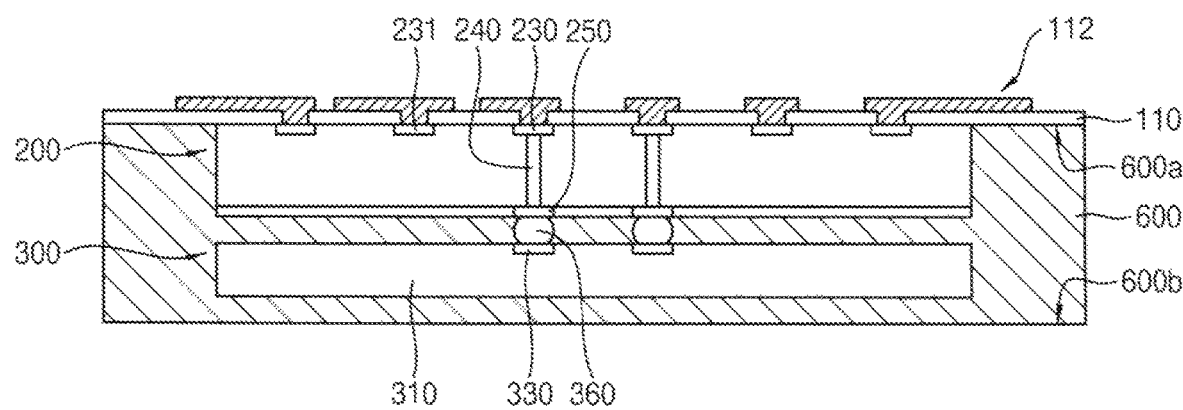

Referring to FIGS. 32 and 33, a first insulation layer 110 may be formed to cover the first surface 600*a* of the molding member 600, and then, the first insulation layer 110 may be patterned to form first openings 111 exposing the first and second chip pads 230, 231 respectively. Then, first redistribution wirings 112 may be formed on the first insulation layer 110 to make contact with the first and second chip pads 230, 231 through the first openings 111, respectively.

Figure 34:
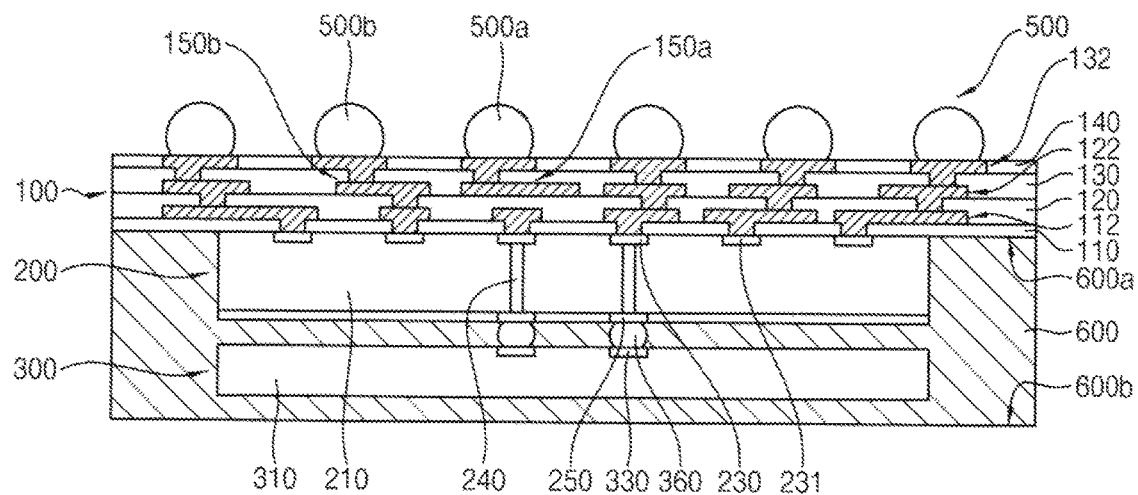

Referring to FIG. 34, processes the same as or similar to the processes described with reference to FIGS. 32 and 33 may be performed to form a redistribution wiring layer 100 on the first surface 600*a* of the molding member 600, and then, outer connection members 500 may be formed on an outer surface of the redistribution wiring layer 100.

In example embodiments, a second insulation layer 120 and second redistribution wirings 122 may be formed on the first insulation layer 110 and the first redistribution wirings 112. The second insulation layer 120 may be formed on the first insulation layer 110 to have openings exposing the first redistribution wirings 112 respectively. The second redistribution wiring 122 may be formed on a portion of the second insulation layer 120 and a portion of the first redistribution wiring 112.

A third insulation layer 130 and third redistribution wirings 132 may be formed on the second insulation layer 120 and the second redistribution wirings 122. The third insulation layer 130 may be formed on the second insulation layer 120 to have openings exposing the second redistribution wirings 122, respectively. The third redistribution wiring 132 may be formed on a portion of the third insulation layer 130 and a portion of the second redistribution wiring 122.

Thus, a redistribution wiring layer 100 including redistribution wirings electrically connected to the first and second chip pads 230, 231 may be formed on the first surface 600*a* of the molding member 600. It may be understood that the number, sizes, arrangements, etc. of the insulation layers of the redistribution wiring layer 100 may not be limited thereto.

Then, outer connection members 500 electrically connected to the redistribution wirings may be formed on the redistribution wiring layer 100. For example, a solder ball as the outer connection member may be disposed on a portion of the third redistribution wiring 132. In this case, the portion of the third redistribution wiring 132 may serve as a landing pad, that is, a package pad. Thus, the redistribution wiring layer 100 may be formed to include fan-out type solder ball landing pads which are formed on the molding member 600 corresponding to each die of a wafer by performing semiconductor manufacturing processes.

Then, a sawing process may be performed on the molding member 600 to form an individual fan-out wafer level package including the molding member 600 and the redistribution wiring layer 100 on the molding member 600.

Figure 35:
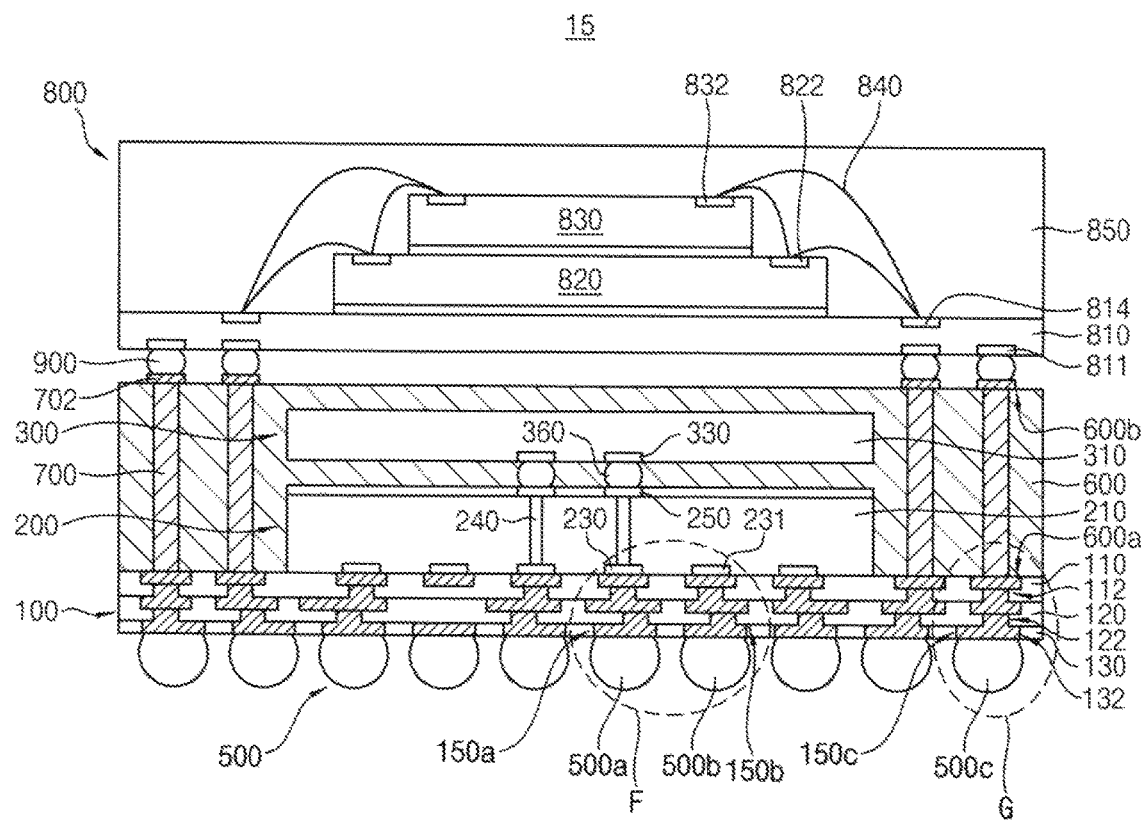
Figure 36:
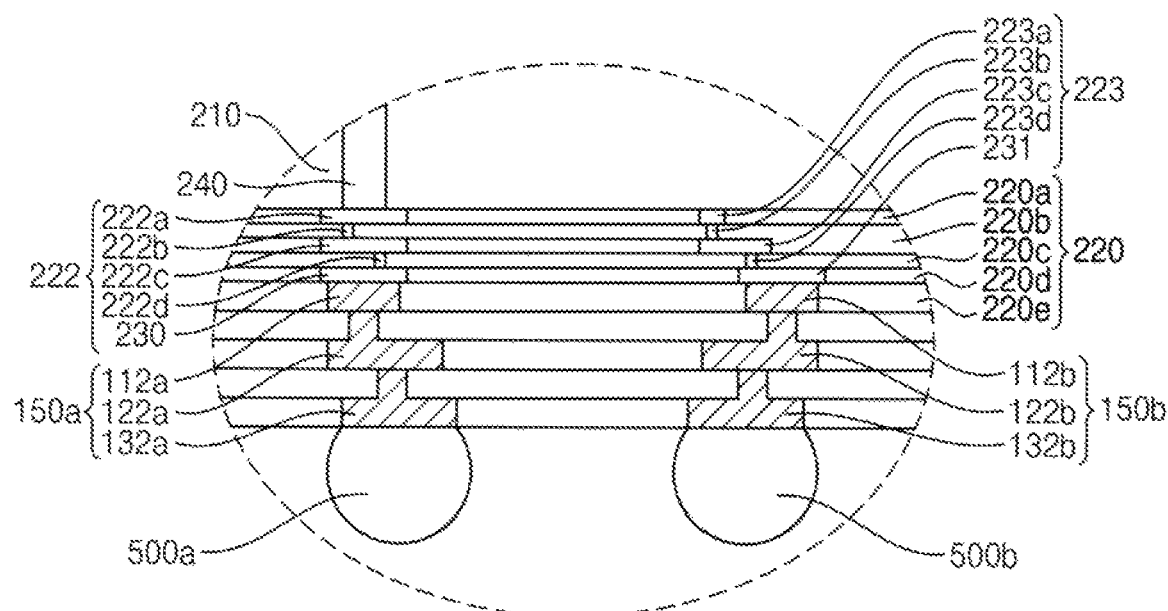
Figure 37:
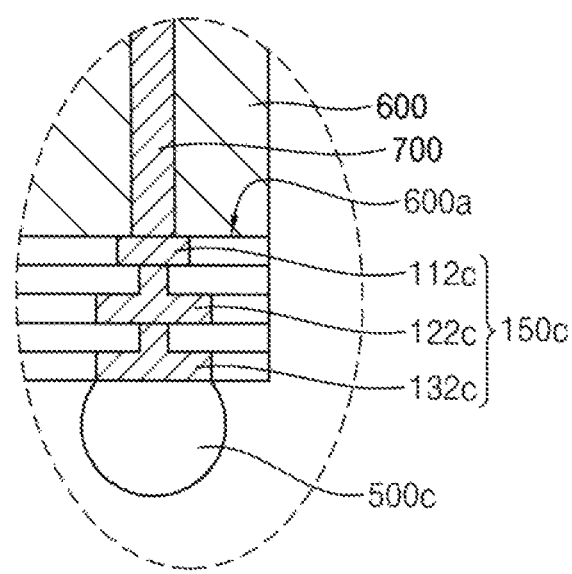

FIG. 35 is a cross-sectional view illustrating a semiconductor package in accordance with example embodiments. FIG. 36 is an enlarged cross-sectional view illustrating portion 'F' in FIG. 35. FIG. 37 is an enlarged cross-sectional view illustrating portion 'G' in FIG. 35. The semiconductor package may be substantially the same as or similar to the semiconductor package described with reference to FIG. 27 except for an additional second package. Thus, the same reference numerals will be used to refer to the same or like elements and any further repetitive explanation concerning the above elements may be omitted.

Referring to FIGS. 35 to 37, a semiconductor package 15 may include a first package and a second package 800 stacked on the first package. The second package may be stacked on the first package via conductive connection members 900.

In example embodiments, the first package may include a molding member 600, first and second semiconductor chips 200, 300 arranged in the molding member 600, and a redistribution wiring layer 100 covering a first surface 600*a* of the molding member 600 and including redistribution wirings electrically connected to first and second chip pads 230, 231 of the first semiconductor chip 200. Additionally, the first package may further include conductive bumps 360 for electrical connection between the first and second semiconductor chips 200, 300, outer connection members 500 for electrical connection with an external device, and conductive connection members, that is, conductive connection columns 700 in an outer region of the first and second semiconductor chips 200, 300 and penetrating through at least a portion of the molding member 600.

The first package may further include a backside redistribution wiring layer having backside redistribution wirings 702 provided on a second surface 600*b* of the molding member 600. For example, the backside redistribution wirings 702 may be formed on the second surface 600*b* of the molding member 600. The backside redistribution wirings 702 may be formed on upper surfaces of the conductive connection columns 700 exposed by the second surface 600b of the molding member 600, respectively. The conductive connection columns 700 may be electrically connected to the backside redistribution wirings 702.

The second package 800 may be stacked on the first package via the conductive connection members 900 on the second surface 600b of the molding member 600. For example, the conductive connection members 900 may include solder balls, conductive bumps, etc. The conductive connection members 900 may be arranged between the backside redistribution wiring 702 on the conductive connection column 700 and a first bonding pad of a second package substrate 810. Accordingly, the first package and the second package 800 may be electrically connected to each other by the conductive connection members 900.

Fourth and fifth semiconductor chips 820, 830 may be stacked on the second package substrate 810 by adhesive members. Bonding wires 840 may electrically connect chip pads 822, 832 of the fourth and fifth semiconductor chips 820, 830 to second bonding pads 814 of the second package substrate 810. The fourth and fifth semiconductor chips 820, 830 may be electrically connected to the second package substrate 810 by the bonding wires 840.

Although the second package 800 including two semiconductor chips mounted in a wire bonding manner is illustrated in the figure, it may be understood that the number, the mounting manner, etc. of the semiconductor chips of the second package may not be limited thereto.

In example embodiments, the redistribution wiring layer 100 may include a first redistribution wiring line 150a electrically connected to the first chip pad 230, a second redistribution wiring line 150b electrically connected to the second chip pad 231, and a third redistribution wiring line 150c electrically connected to the conductive connection columns 700.

The outer connection members 500 may be disposed on package pads in an outer surface of the redistribution wiring layer 100. The outer connection members 500 may include a first outer connection member 500a electrically connected to the first redistribution wiring line 150a, a second outer connection member 500b electrically connected to the second redistribution wiring line 150b and a third outer connection member 500c electrically connected to the third redistribution wiring line 150c. For example, each outer connection member 500 may include a solder ball.

The first redistribution wiring line 150a may include first to third redistribution wirings 112a, 122a, 132a electrically connected to each other. The first redistribution wiring 112a of the first redistribution wiring line 150a may make contact with the first chip pad 230. A portion of the third redistribution wiring 132a of the first redistribution wiring line 150a may serve as a first landing pad, that is, a first package pad. The first outer connection member (first solder ball) 500a may be disposed the first package pad. Thus, the first outer connection member 500a may be electrically connected to a through electrode 240 through the first redistribution wiring line 150a of the redistribution wiring layer 100 and a first wiring 222.

The second redistribution wiring line 150b may include first to third redistribution wirings 112b, 122b, 132b electrically connected to each other. The first redistribution wiring 112b of the second redistribution wiring line 150b may make contact with the second chip pad 231. A portion of the third redistribution wiring 132b of the second redistribution wiring line 150b may serve as a second landing pad, that is, a second package pad. The second outer connection member (second solder ball) 500b may be disposed on the second package pad. Thus, the second outer connection member 500b may be electrically connected to a circuit element in a substrate 210 through the second redistribution wiring line 150b of the redistribution wiring layer 100 and a second wiring 223.

The third redistribution wiring line 150c may include first to third redistribution wirings 112c, 122c, 132c electrically connected to each other. The first redistribution wiring 112c of the third redistribution wiring line 150c may make contact with the conductive connection column 700. A portion of the third redistribution wiring 132c of the third redistribution wiring line 150c may serve as a third landing pad, that is, a third package pad. The third outer connection member (third solder ball) 500c may be disposed on the third package pad. Thus, the third outer connection member 500c may be electrically connected to the second package 800 through the third redistribution wiring line 150c of the redistribution wiring layer 100 and the conductive connection column 700.

Accordingly, the first redistribution wiring line 150a of the redistribution wiring layer 100 and the through electrode 240 of the first semiconductor chip 200 may serve as a first input/output signal line for the second semiconductor chip 300. The second redistribution wiring line 150b of the redistribution wiring layer 100 may serve as a second input/output signal line for the first semiconductor chip 200. The second redistribution wiring line 150c of the redistribution wiring layer 100 and the conductive connection column 700 may serve as a third input/output signal line for the second package 800.

Hereinafter, a method of manufacturing the semiconductor package in FIG. 35 will be explained.

FIGS. 38 to 46 are cross-sectional views illustrating a method of manufacturing a semiconductor package in accordance with example embodiments.

Figure 38:
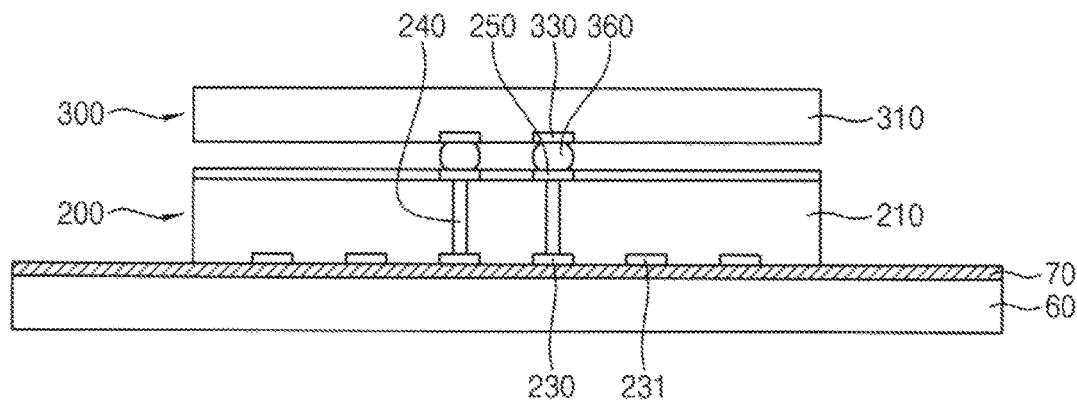

Referring to FIG. 38, first, a conductive layer 70 may be formed on a dummy substrate 60, and then, first and second semiconductor chips 200, 300 may be sequentially stacked on the conductive layer 70.

In example embodiments, the dummy substrate 60 may be used as a base substrate on which the first and second semiconductor chips 200, 300 are stacked and a mold substrate is to be formed to cover the first and second semiconductor chips 200, 300. The dummy substrate 60 may have a size corresponding to a wafer on which a semiconductor fabrication process is performed. The dummy substrate 60 may include, for example, a silicon substrate, a glass substrate, or a non-metal or metal plate.

Then, the conductive layer 70 may be formed on the dummy substrate 60. For example, the conductive layer 70 may be formed by laminating a metal foil. Alternatively, the conductive layer 70 may be formed by depositing a metal. Examples of the metal may be copper (Cu), gold (Au), aluminum (Al), tungsten (W), nickel (Ni), titanium (Ti), or an alloy thereof.

The first semiconductor chip 200 may be adhered on the dummy substrate 60 such that a second surface of the first semiconductor chip 200 faces up, and then, the second semiconductor chip 300 may be stacked on the first semiconductor chip 200. The second semiconductor chip 300 may be stacked on the first semiconductor chip 200 such that a first surface of the second semiconductor chip 300 having chip pads 330 formed thereon faces the second surface of the first semiconductor chip 200.

Figure 39:
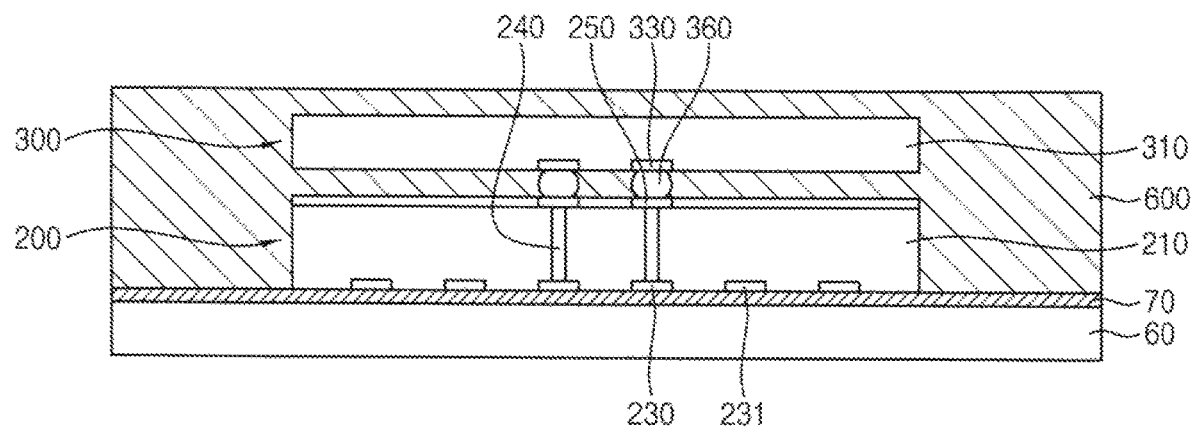

Referring to FIG. 39, a molding member 600 as a mold substrate may be formed on the dummy substrate 60 to cover the first and second semiconductor chips 200, 300.

Figure 40:
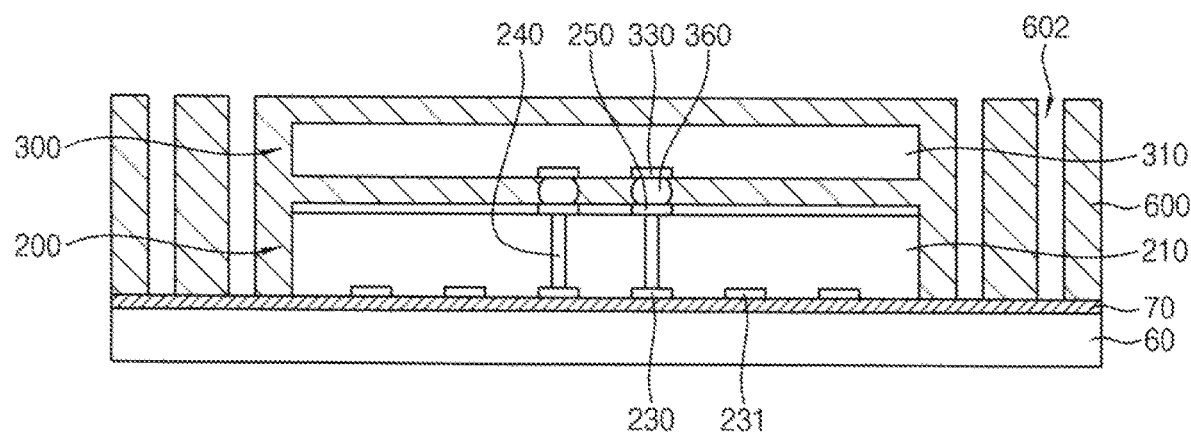
Figure 41:
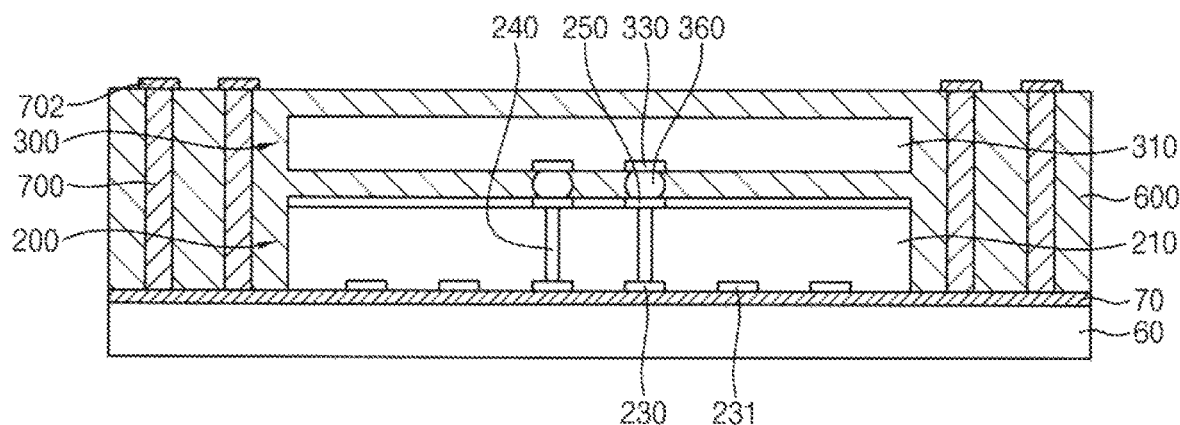

Referring to FIGS. 40 and 41, openings 602 may be formed in the molding member 600 to expose conductive connection column regions, respectively, and then, conductive connection columns 700 may be formed in the openings 602. Then, backside redistribution wirings 702 may be formed on portions of the conductive connection columns 700 that are exposed by (e.g., free of) a second surface of the molding member 600.

For example, the openings 602 may be formed by a laser drilling process. An electroplating process may be performed on a portion of the conductive layer 70 exposed by the opening 602 to form the conductive connection column 700.

A seed layer may be formed on the second surface of the molding member 600, that is, the backside, and then, the seed layer may be patterned to form the backside redistribution wirings 702.

Figure 42:
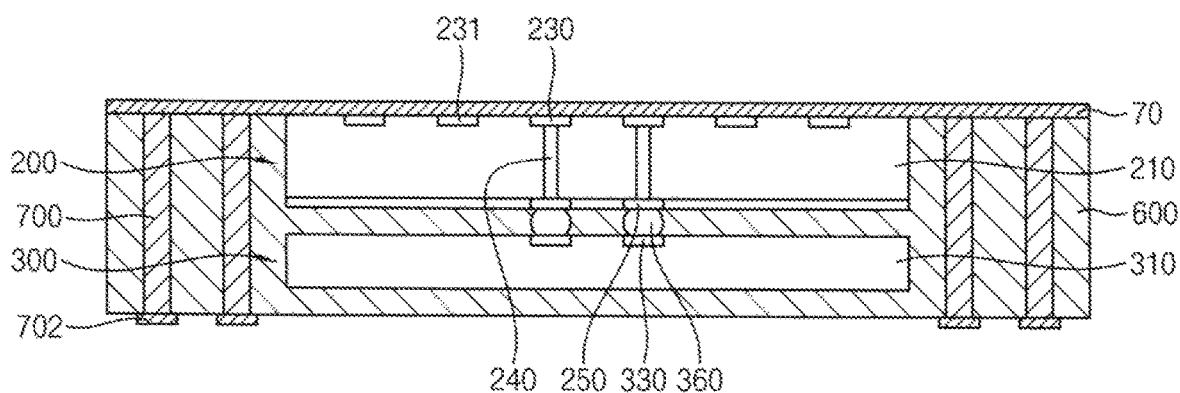
Figure 43:
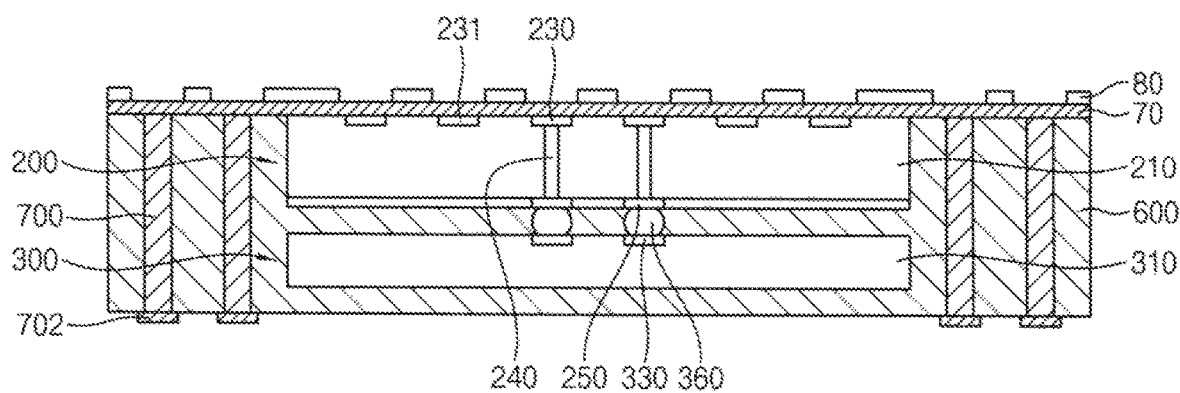
Figure 44:
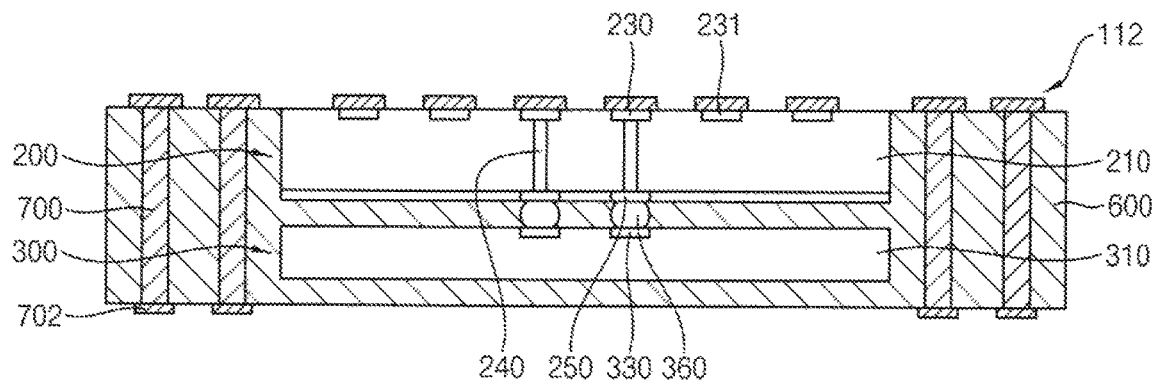

Referring to FIGS. 42 to 44, the structure including the molding member 600 formed therein in FIG. 41 may be reversed (e.g., rotated/flipped), a photoresist pattern 80 having openings which expose first redistribution wiring regions may be formed on the conductive layer 70, and then, the conductive layer 70 may be patterned using the photoresist pattern 80 to form first redistribution wirings 112.

For example, a photoresist layer may be formed on the conductive layer 70 on a first surface of the molding member 600, and then, an exposure and development process may be performed to form the photoresist pattern 80. The conductive layer 70 may be etched using the photoresist pattern 80 as an etching mask to form the first redistribution wirings 112. The first redistribution wirings 112 may be formed on surfaces of the conductive connection columns 700.

Figure 45:
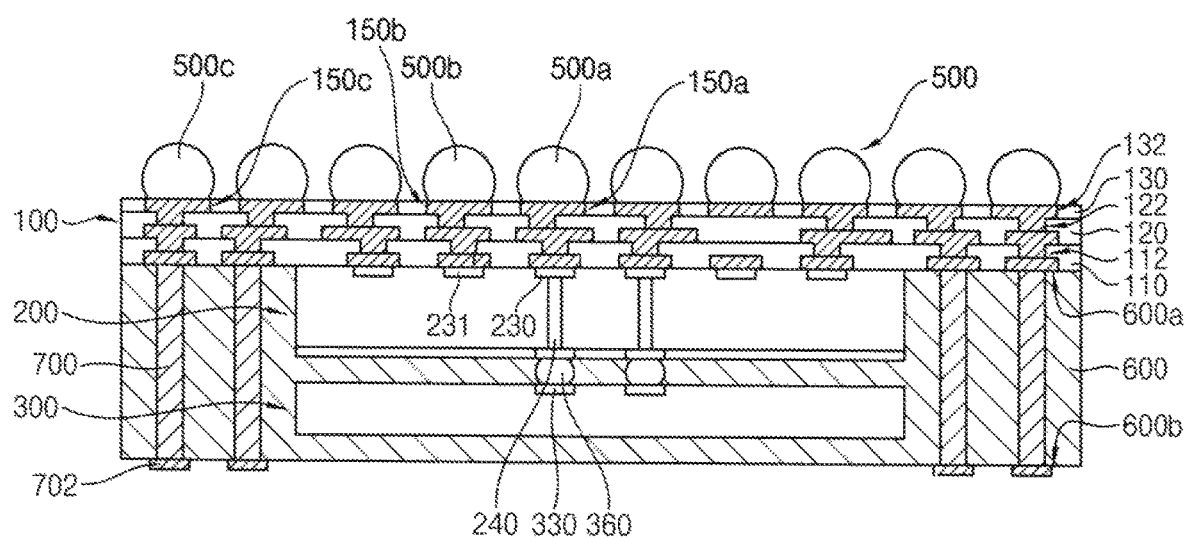

Referring to FIG. 45, processes the same as or similar to the processes described with reference to FIG. 34 may be performed to form a redistribution wiring layer 100 on the first surface 600a of the molding member 600, and then, outer connection members 500 may be formed on the redistribution wiring layer 100.

Then, a sawing process may be performed on the molding member 600 to form an individual first package including the molding member 600 and the redistribution wiring layer 100 on the molding member 600.

Figure 46:
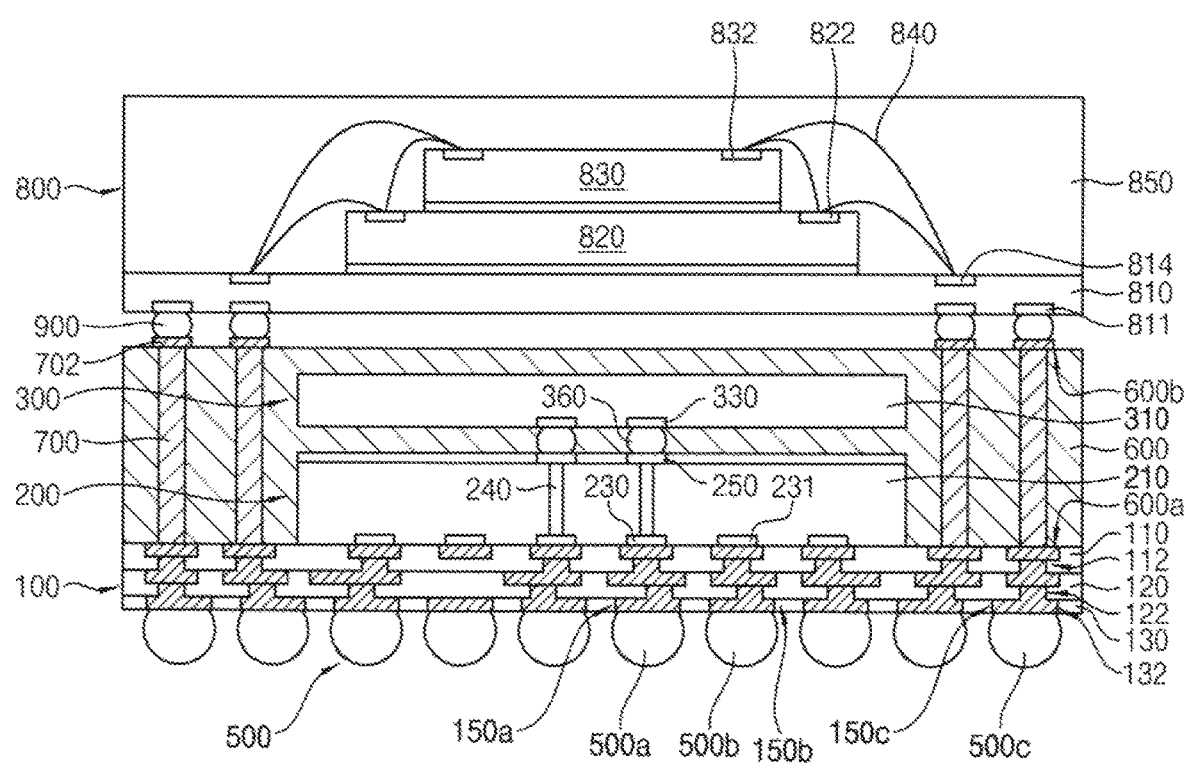

Referring to FIG. 46, a second package 800 may be stacked on the first package.

In example embodiments, the second package 800 may include a second package substrate 810, fourth and fifth semiconductor chips 820, 830 mounted on the second package substrate 810, and a molding member 850 on the second package substrate 810 to cover the fourth and fifth semiconductor chips 820, 830.

The second package 800 may be stacked on the first package via conductive connection members 900 on the second surface 600b of the molding member 600. For example, the conductive connection members 900 may include solder balls, conductive bumps, etc. The conductive connection member 900 may be arranged between the backside redistribution wiring 702 on the conductive connection column 700 and a first bonding pad 811 of the second package substrate 810. Accordingly, the first package and the second package 800 may be electrically connected to each other by the conductive connection members 900.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, high bandwidth memory (HBM) devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:
1. A semiconductor package comprising:
a first semiconductor chip including a first semiconductor substrate having a first surface and a second surface opposite to the first surface, a through electrode that extends through the first semiconductor substrate, a first chip pad on the first surface and electrically connected to a first end of the through electrode, and a second chip pad on the first surface and electrically connected to a circuit element in the first semiconductor substrate;
a redistribution wiring layer on and integrally with the first surface of the first semiconductor chip such that there is no space between the first surface of the first semiconductor substrate and the redistribution wiring layer, the redistribution wiring layer including a first redistribution wiring line electrically connected to the first chip pad and a second redistribution wiring line electrically connected to the second chip pad;
an insulation layer on the second surface of the first semiconductor substrate, the insulation layer having an upper surface that is planar across the second surface of the first semiconductor substrate;
a planar third chip pad in the insulation layer on the second surface of the first semiconductor substrate and electrically connected to a second end of the through electrode opposite the first end of the through electrode, the third chip pad having an upper surface that is exposed from the upper surface of the insulation layer, the upper surface of the third chip pad being coplanar with the upper surface of the insulation layer;
a second semiconductor chip stacked on the second surface of the first semiconductor chip, overlapping the first, second and third chip pads and the through electrode in a vertical direction, the second semiconductor chip electrically connected to the through electrode via the third chip pad and electrically isolated from the second redistribution wiring line;
an adhesive layer on an outer surface of the second semiconductor chip; and
a molding member on a side surface of the first semiconductor chip, a side surface of the redistribution wiring layer, a side surface of the second semiconductor chip, a side surface of the insulation layer and a side surface of the adhesive layer,
wherein the side surface of the redistribution wiring layer is coplanar with the side surface of the first semiconductor chip and the side surface of the second semiconductor chip.
2. The semiconductor package of claim 1, wherein the molding member extends between the first semiconductor chip and the second semiconductor chip.
3. The semiconductor package of claim 1, further comprising:

a second adhesive layer between the first semiconductor chip and the second semiconductor chip to adhere the first and second semiconductor chips to each other.

4. The semiconductor package of claim 1, further comprising:
a conductive bump interposed between the first semiconductor chip and the second semiconductor chip to electrically connect the through electrode to the second semiconductor chip,
wherein no conductive bump between the first semiconductor chip and the second semiconductor chip is electrically connected to the second redistribution wiring line.

5. The semiconductor package of claim 4, wherein the conductive bump has a diameter of about 10 micrometers (μm) to about 100 (μm).

6. The semiconductor package of claim 4, wherein the second semiconductor chip includes a second semiconductor substrate and a fourth chip pad on a third surface of the second semiconductor substrate that faces the second surface of the first semiconductor substrate, wherein the conductive bump is on the fourth chip pad, and wherein the fourth chip pad and the conductive bump are between the first and second semiconductor substrates, the semiconductor package further comprising an insulation interlayer on the third surface of the second semiconductor substrate, the fourth chip pad being in an outermost insulation layer of the insulation interlayer.

7. The semiconductor package of claim 1, further comprising:
outer connection members on an outer surface of the redistribution wiring layer.

8. The semiconductor package of claim 7, wherein the outer connection members include a first solder ball electrically connected to the first redistribution wiring line and a second solder ball electrically connected to the second redistribution wiring line.

9. The semiconductor package of claim 8, wherein the first and second solder balls each have a diameter of about 300 micrometers (μm) to about 500 μm.

10. The semiconductor package of claim 1, wherein the first semiconductor chip further includes an insulation interlayer on the first surface of the first semiconductor chip, wherein the insulation interlayer has the first and second chip pads in an outer surface thereof.

11. The semiconductor package of claim 1, wherein the second semiconductor chip is connected to the first semiconductor chip without bond wires.

12. A semiconductor package comprising:
a first semiconductor chip including a first semiconductor substrate having a first surface and a second surface opposite to the first surface, and including a first chip pad in the first surface electrically connected to a first end of a through electrode that extends through the first semiconductor substrate of the first semiconductor chip and a second chip pad in the first surface electrically connected to a circuit element that is in the first semiconductor substrate;
an insulation layer on the second surface of the first semiconductor substrate, the insulation layer having an upper surface that is planar across the second surface of the first semiconductor substrate;
a planar third chip pad in the insulation layer on the second surface of the first semiconductor substrate and electrically connected to a second end of the through electrode opposite the first end of the through electrode, the third chip pad having an upper surface that is exposed from an upper surface of the insulation layer, the upper surface of the third chip pad being coplanar with the upper surface of the insulation layer;
a second semiconductor chip stacked on the second surface of the first semiconductor substrate, extending across the first, second and third chip pads and the through electrode in a vertical direction, the second semiconductor chip electrically connected to the through electrode of the first semiconductor chip by a conductive bump between the third chip pad and the second semiconductor chip;
a redistribution wiring layer on and integrally with the first surface of the first semiconductor substrate such that there is a continuous interface between the first surface of the first semiconductor substrate and the redistribution wiring layer, the redistribution wiring layer including a first redistribution wiring line electrically connected to the first chip pad and a second redistribution wiring line electrically connected to the second chip pad;
an adhesive layer on an outer surface of the second semiconductor chip; and
a molding member on a side surface of the first semiconductor chip, a side surface of the redistribution wiring layer, a side surface of the second semiconductor chip, a side surface of the insulation layer and a side surface of the adhesive layer,
wherein the side surface of the redistribution wiring layer is coplanar with the side surface of the first semiconductor chip and the side surface of the second semiconductor chip,
wherein the first redistribution wiring line and the through electrode collectively provide a first input/output signal line for the second semiconductor chip, and
wherein the second redistribution wiring line provides a second input/output signal line for the first semiconductor chip and not for the second semiconductor chip; and
outer connection members on an outer surface of the redistribution wiring layer and electrically connected to the first and second redistribution wiring lines, respectively.

13. The semiconductor package of claim 12, wherein the molding member extends between the first semiconductor chip and the second semiconductor chip.

14. The semiconductor package of claim 12, further comprising:
a second adhesive layer between the first semiconductor chip and the second semiconductor chip to adhere the first and second semiconductor chips to each other.

15. The semiconductor package of claim 12, wherein the molding member is on the outer surface of the redistribution wiring layer.

16. The semiconductor package of claim 12, wherein the conductive bump has a diameter of about 10 micrometers (μm) to about 100 μm.

17. The semiconductor package of claim 12, wherein the outer connection members include a first solder ball electrically connected to the first redistribution wiring line and a second solder ball electrically connected to the second redistribution wiring line.

18. The semiconductor package of claim 12,
wherein the first and second input/output signal lines are electrically isolated from each other, and
wherein no through electrode of the first semiconductor chip is part of the second input/output signal line.

19. The semiconductor package of claim 12,
wherein the second semiconductor chip includes a second semiconductor substrate and a fourth chip pad in a third surface of the second semiconductor substrate that faces the second surface of the first semiconductor substrate, wherein the fourth chip pad is between the first semiconductor substrate and the second semiconductor substrate,
wherein the conductive bump comprises a first conductive bump that is between the third and fourth chip pads,
wherein the through electrode comprises a first through electrode, and
wherein the semiconductor package further comprises a second through electrode that extends through the first semiconductor substrate and a second conductive bump that electrically connects the second semiconductor chip to the second through electrode.

20. A fan-in, wafer level semiconductor package comprising:
a redistribution wiring layer including a first redistribution wiring line and a second redistribution wiring line on a first surface of the redistribution wiring layer;
a first semiconductor chip on and integrally with the redistribution wiring layer such that there is a continuous interface between the first surface of the redistribution wiring layer and the first semiconductor chip, the first semiconductor chip including a first semiconductor substrate, a first chip pad electrically connected to the first redistribution wiring line, a second chip pad electrically connected to the second redistribution wiring line, and a through electrode electrically connected to the first chip pad, wherein the through electrode extends through the first semiconductor substrate, wherein the first and second chip pads are on a first surface of the first semiconductor substrate, wherein there is an absence of solder bumps between the first and second chip pads and the redistribution wiring layer, and wherein no through electrode of the first semiconductor chip is electrically connected to the second chip pad;
an insulation layer on a second surface of the first semiconductor substrate, the insulation layer having an upper surface that is planar across the second surface of the first semiconductor substrate;
a planar third chip pad in the insulation layer on a second surface of the first semiconductor substrate opposite the first surface of the first semiconductor substrate and electrically connected to the through electrode, the third chip pad having an upper surface that is exposed from an upper surface of the insulation layer, the upper surface of the third chip pad being coplanar with the upper surface of the insulation layer;
a second semiconductor chip stacked on the first semiconductor chip, extending across the first, second and third chip pads and the through electrode, the second semiconductor chip electrically connected to the through electrode via the third chip pad;
an adhesive layer on an outer surface of the second semiconductor chip;
a molding member that continuously extends along each of a side surface of the first semiconductor chip, a side surface of the redistribution wiring layer, a side surface of the second semiconductor chip, a side surface of the insulation layer and a side surface of the adhesive layer; and
outer connection members on a second surface of the redistribution wiring layer opposite the first surface,
wherein the side surface of the redistribution wiring layer is coplanar with the side surface of the first semiconductor chip and the side surface of the second semiconductor chip.

* * * * *